United States Patent
Honda et al.

(10) Patent No.: US 7,639,164 B2
(45) Date of Patent: Dec. 29, 2009

(54) OUTPUT DATA CORRECTION DEVICE FOR ANALOG-TO-DIGITAL CONVERSION CIRCUIT AND ANALOG-TO-DIGITAL CONVERTED OUTPUT DATA CORRECTION METHOD

(75) Inventors: Takuya Honda, Nagoya (JP); Takuya Harada, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/076,958

(22) Filed: Mar. 26, 2008

(65) Prior Publication Data

US 2008/0238738 A1    Oct. 2, 2008

(30) Foreign Application Priority Data

Mar. 28, 2007  (JP) ............... 2007-084582
Oct. 17, 2007  (JP) ............... 2007-270246

(51) Int. Cl.
*H03M 1/06* (2006.01)
(52) U.S. Cl. .................. 341/118; 341/144
(58) Field of Classification Search ............ 341/144, 341/141, 122, 118, 120, 155
See application file for complete search history.

(56) References Cited

U.S. PATENT DOCUMENTS 5,933,199 A * 8/1999 Yoon ............... 348/674
6,861,967 B2   3/2005 Tanizawa

* cited by examiner

*Primary Examiner*—Peguy JeanPierre
(74) *Attorney, Agent, or Firm*—Posz Law Group, PLC

(57) ABSTRACT

An output data correction device is provided for an A/D conversion circuit that achieves high precision over input voltage domains. An estimated maximum input ranging from 0 V to 5 V is divided into domains. A comparison circuit decides to which of the domains a voltage Vin input to a pulse phase-difference encoding circuit belongs. Control logic and a digital analog controller (DAC) select and transmit reference voltages associated with each of the domains. When each of the reference voltages is selected, a quadratic functional equation is computed and determined. A graph of the function passes coordinate points representing the reference voltages in a coordinate system with reference voltages and A/D-converted data values as dimensions. When each input voltage is selected, the A/D-converted digital data is corrected using the quadratic functional equation associated with the domain to which the input voltage Vin is decided to belong.

18 Claims, 26 Drawing Sheets

FIG. 4

| INPUT VOLTAGE RANGE | RESULT OF PARALLEL COMPARISON | RESULT OF ENCODING | THREE REFERENCE VOLTAGES | | | THREE REFERENCE VOLTAGES (DAC DATA ITEMS) | | | COMPUTED ADDITION DATA α |
|---|---|---|---|---|---|---|---|---|---|
| | | | N3 | N2 | N1 | N3 | N2 | N1 | |
| 0.000V ~ 0.625V | 0000000 | 000 | 0.0000V | 0.3125V | 0.6250V | 00000 | 00001 | 00010 | −28672 |
| 0.625V ~ 1.250V | 0000001 | 001 | 0.6250V | 0.9375V | 1.2500V | 00010 | 00011 | 00100 | −20480 |
| 1.250V ~ 1.875V | 0000011 | 010 | 1.2500V | 1.5625V | 1.8750V | 00100 | 00101 | 00110 | −12288 |
| 1.875V ~ 2.500V | 0000111 | 011 | 1.8750V | 2.1875V | 2.5000V | 00110 | 00111 | 01000 | −4096 |
| 2.500V ~ 3.125V | 0001111 | 100 | 2.5000V | 2.8125V | 3.1250V | 01000 | 01001 | 01010 | 4096 |
| 3.125V ~ 3.750V | 0011111 | 101 | 3.1250V | 3.4375V | 3.7500V | 01010 | 01011 | 01100 | 12288 |
| 3.750V ~ 4.375V | 0111111 | 110 | 3.7500V | 4.0625V | 4.3750V | 01100 | 01101 | 01110 | 20480 |
| 4.375V ~ 5.000V | 1111111 | 111 | 4.3750V | 4.6875V | 5.0000V | 01110 | 01111 | 10000 | 28672 |

FIG. 12

| INPUT VOLTAGE RANGE | RESULT OF PARALLEL COMPARISON | RESULT OF ENCODING | THREE REFERENCE VOLTAGES | | | THREE REFERENCE VOL. (DAC DATA ITEMS) | | | ADDITION VOLTAGE | DAC DATA OF ADDITION VOLTAGE | COMPUTED ADDITION DATA α |
|---|---|---|---|---|---|---|---|---|---|---|---|
| | | | N3 | N2 | N1 | N3 | N2 | N1 | | | |
| 0.000V ~ 0.625V | 0000000 | 000 | 2.5000V | 2.8125V | 3.1250V | 1000 | 1001 | 1010 | 4.6875V | 1111 | −28672 |
| 0.625V ~ 1.250V | 0000001 | 001 | | | | | | | 4.0625V | 1101 | −20480 |
| 1.250V ~ 1.875V | 0000011 | 010 | | | | | | | 3.4375V | 1011 | −12288 |
| 1.875V ~ 2.500V | 0000111 | 011 | | | | | | | 2.8125V | 1001 | −4096 |
| 2.500V ~ 3.125V | 0001111 | 100 | | | | | | | 2.1875V | 0111 | 4096 |
| 3.125V ~ 3.750V | 0011111 | 101 | | | | | | | 1.5625V | 0101 | 12288 |
| 3.750V ~ 4.375V | 0111111 | 110 | | | | | | | 0.9375V | 0011 | 20480 |
| 4.375V ~ 5.000V | 1111111 | 111 | | | | | | | 0.3125V | 0001 | 28672 |

FIG. 20

| RESOLUTION IN A/D CONVERSION | | 8 | 10 | 12 | 14 | 16 | 18 |
|---|---|---|---|---|---|---|---|
| CORRECTIONAL COEFFICIENT CONSTANT | | 16 | 64 | 256 | 1024 | 4096 | 16384 |
| COMPUTED ADDITION DATA α | ① | -112 | -448 | -1792 | -7168 | -28672 | -114688 |
| | ② | -80 | -320 | -1280 | -5120 | -20480 | -81920 |
| | ③ | -48 | -192 | -768 | -3072 | -12288 | -49152 |
| | ④ | -16 | -64 | -256 | -1024 | -4096 | -16384 |
| | ⑤ | 16 | 64 | 256 | 1024 | 4096 | 16384 |
| | ⑥ | 48 | 192 | 768 | 3072 | 12288 | 49152 |
| | ⑦ | 80 | 320 | 1280 | 5120 | 20480 | 81920 |
| | ⑧ | 112 | 448 | 1792 | 7168 | 28672 | 114688 |

FIG. 24

| INPUT VOLTAGE RANGE | RESULT OF PARALLEL COMPARISON | RESULT OF DECODING | THREE REFERENCE VOLTAGES | | | THREE REFERENCE VOLTAGES (DAC DATA ITEMS) | | | COMPUTED ADDITION DATA α |
|---|---|---|---|---|---|---|---|---|---|
| | | | N3 | N2 | N1 | N3 | N2 | N1 | |
| 0.000V ~ 0.625V | 0000000 | 000 | 0.0000V | 0.3125V | 0.6250V | 00000 | 00001 | 00010 | -32768 |
| 0.625V ~ 1.250V | 0000001 | 001 | 0.6250V | 0.9375V | 1.2500V | 00010 | 00011 | 00100 | -24576 |
| 1.250V ~ 1.875V | 0000011 | 010 | 1.2500V | 1.5625V | 1.8750V | 00100 | 00101 | 00110 | -16384 |
| 1.875V ~ 2.500V | 0000111 | 011 | 1.8750V | 2.1875V | 2.5000V | 00110 | 00111 | 01000 | -8192 |
| 2.500V ~ 3.125V | 0001111 | 100 | 2.5000V | 2.8125V | 3.1250V | 01000 | 01001 | 01010 | 0 |
| 3.125V ~ 3.750V | 0011111 | 101 | 3.1250V | 3.4375V | 3.7500V | 01010 | 01011 | 01100 | 8192 |
| 3.750V ~ 4.375V | 0111111 | 110 | 3.7500V | 4.0625V | 4.3750V | 01100 | 01101 | 01110 | 16384 |
| 4.375V ~ 5.000V | 1111111 | 111 | 4.3750V | 4.6875V | 5.0000V | 01110 | 01111 | 10000 | 24576 |

OUTPUT DATA CORRECTION DEVICE FOR ANALOG-TO-DIGITAL CONVERSION CIRCUIT AND ANALOG-TO-DIGITAL CONVERTED OUTPUT DATA CORRECTION METHOD

CROSS REFERENCE TO RELATED APPLICATIONS

The present invention is based on and claims priority to Japanese Patent Application No. 2007-084582 filed on Mar. 28, 2007 and on Japanese Patent Application No. 2007-270246 filed on Oct. 17, 2007.

BACKGROUND OF THE INVENTION

1. Field of the Invention

The present invention relates to a device and a method for correcting converted data that is provided by an analog-to-digital (A/D) conversion circuit exhibiting non-linear conversion characteristics and, more specifically, to correcting converted data so that the conversion characteristic will be linear.

2. Description of the Related Art

Linear conversion is a desirable objective for data conversion circuits particularly since non-linearities tend to produce distortion and other undesirable effects. Japanese Patent JP-A-2005-45538 discloses a prior art technology for performing correction in connection with a pulse phase-difference encoding circuit so that the conversion characteristic of an A/D conversion circuit that exhibits a non-linear conversion characteristic will become linear.

In JP-A-2005-45538, correction begins with analog-to-digital (A/D) converting predetermined reference voltages v0, v1, and v2 in order to produce digital data conversion values or vectors d0, d1, and d2. On the other hand, arbitrary reference digital values y1 and y2 meeting a condition of $y1/y2=(v1-v0)/(v2-v0)=\frac{1}{2}$ are predetermined.

After x1 and x2 are obtained by performing arithmetic operations $x1=d1-d0$ and $x2=d2-d0$, a quadratic functional equation whose graph passes points, which are represented by x and y coordinates as $D(x1,y1)$ and $E(x2,y2)$, as well as an origin is designated as a linear correctional equation. The linear correctional equation, obtained as described above and used for generating correctional values, is used to generate a shift value x, which is calculated by subtracting d0 from data ds, which exhibits non-linearity. The value x is sent from the A/D conversion circuit, so as to produce a linearity correctional value.

An actual conversion characteristic exhibited by the above A/D conversion circuit is expressed with a curve representing the 1.4-th to 1.5-th powers of values that should be provided by the A/D conversion circuit. Consequently, when the quadratic functional equation is used for correction as it is in JP-A-2005-45538, approximation is performed merely roughly. An error in corrected converted data gets larger depending on how to designate three reference voltages relative to an input voltage domain.

SUMMARY OF THE INVENTION

The disadvantages associated with the above described rough approximation are eliminated and increased accuracy over that provided in association with conventional approaches is provided. An object of various exemplary embodiments is to provide an output data correction device for an A/D conversion circuit and an A/D converted output data correction method both of which achieve correction with higher precision over all input voltage domains.

According to a first aspect of invention as described in greater detail according to the exemplary embodiments described hereinbelow, an output data correction device for an exemplary A/D conversion circuit includes a deciding means that decides a number of domains an estimated maximum input range is divided and to which of the domains a voltage input to an A/D conversion circuit belongs. A reference voltage designating means selects and transmits at least three reference voltages associated with each of the domains. If an input selecting means selects the reference voltages, a correctional equation determining means computes and determines an n-th order functional equation whose graph passes coordinate points that represent the three or more reference voltages, in a two-dimensional coordinate system in which the axis of ordinates indicates reference voltages and the axis of abscissas indicates digital data values converted by the A/D conversion circuit. If the input selecting means selects an input voltage, a correcting means corrects digital data that is converted by the A/D conversion circuit, using an n-th order functional equation associated with a domain to which it has been decided that the input voltage belongs.

Even if a range of input voltages is wide, three or more reference voltages are selected for each of domains into which the range is divided. An n-th order functional equation is determined for a correctional equation and used to correct A/D-converted data. Consequently, highly precise correction can be achieved over all the input voltage domains, and a linear conversion characteristic can be provided.

An output data correction device for an A/D conversion circuit is provided in accordance with a second aspect including an input selecting means that initially selects each of the reference voltages as a signal to be input to the A/D conversion circuit. The reference voltage designating means sequentially selects and transmits the reference voltages associated with multiple domains. The correctional equation determining means sequentially determines n-th order functional equations associated with multiple domains, and holds the functional data values. Namely, since the correctional equations associated with the domains are predetermined, the correcting means can use the correctional equations to swiftly correct A/D-converted data values.

An output data correction device for an A/D conversion circuit is provided in accordance with a third aspect including a level converting means that adds a regulation voltage, the regulation voltage associated with a domain and decided by the above described deciding means, to an input voltage and thus converts the level of a signal to be input to the A/D conversion circuit so that the signal level will fall within a predetermined range. Therefore, for a correctional equation, the predetermined range alone should be determined. Eventually, correctional arithmetic processing can be alleviated.

In accordance with a fourth aspect, in connection with an output data correction device for an A/D conversion circuit, every time the A/D conversion circuit A/D-converts a new input voltage, the input selecting means selects the reference voltages. Based on the resultant A/D-converted data, the correctional equation determining means computes a new n-th order functional equation. In other words, the correctional equation determining means defines a correctional equation on the basis of the result of conversion performed by the A/D conversion circuit in the latest condition enabling the correcting means to achieve highly precise correction using the correctional equation.

An output data correction device for an A/D conversion circuit is provided in accordance with a fifth aspect including a pulse phase-difference encoding circuit including a pulse cycling circuit and a counter that are adopted in connection with an A/D conversion circuit in which an A/D conversion output is corrected. Specifically, since a nonlinear change in a signal lag time is caused by a change in a supply voltage to reversal circuits that constitute the pulse cycling circuit, a conversion characteristic exhibited by the A/D conversion circuit having the above components is markedly non-linear. Consequently, correction by the output data correction device in accordance with the present embodiment and other embodiments, can be applied to the A/D conversion circuit with advantageous effect.

According to an output data correction device for an A/D conversion circuit in accordance with a sixth aspect, the order n of a functional equation is set to 2. Since a quadratic functional equation is adopted as a correctional equation, optimal correction can be achieved.

According to an analog-to-digital converted output data correction method of a seventh aspect, an estimated maximum input range is divided into a number of domains. It is decided into which domain a voltage input to the A/D conversion circuit belongs. At least three reference voltages associated with the decided domain are selected. An n-th order functional equation whose graph passes three or more coordinate points in a two-dimensional coordinate system in which the axis of ordinates indicates reference voltages and the axis of abscissas indicates A/D-converted digital data values is computed and determined. A/D-converted data is assigned to the determined n-th order functional equation and thus computed in order to correct the non-linearity in the data. Thus, the seventh aspect can provide the same advantage as the first aspect.

According to an A/D-converted output data correction method of the eighth aspect, at least three reference voltages associated with each of the above noted domains are selected. A predetermined n-th order functional equation is computed in association with each domain. The n-th order functional equation has a graph that passes three or more coordinate points defined in a two-dimensional coordinate system in which the axis of ordinates indicates reference voltages and the axis of abscissas indicates A/D-converted digital data values. To which of the domains a voltage input to the A/D conversion circuit belongs is decided. A/D-converted digital data is assigned to the n-th order functional equation associated with a domain, and thus computed in order to correct the non-linearity in the data. Consequently, the same advantage as that of the second aspect can be provided.

According to an A/D-converted output data correction method of a ninth aspect, an estimated maximum input range is divided into a number of domains. It is decided in to which of the domains a voltage input to an A/D conversion circuit belongs. A regulation voltage associated with a decided domain is added to the input voltage so that the level of the signal input to the A/D conversion circuit will fall within a predetermined range. At least three reference voltages are designated relative to the predetermined range within which the input signal level falls. An n-th order functional equation is computed and determined. A graph of the n-th order functional equation passes coordinate points which represent the three or more reference voltages in a two-dimensional coordinate system in which the axis of ordinates indicates reference voltages and the axis of abscissas indicates digital data values into which the reference voltages are converted by the A/D conversion circuit. A/D-converted digital data is then corrected using the n-th order functional equation. Thus, the same advantage as that of the third aspect can be provided.

According to an A/D-converted output data correction method in accordance with a tenth aspect, every time the A/D conversion circuit A/D-converts a new input voltage, an n-th order functional equation is newly computed. Correction is performed based on the result of the computation. Consequently, the same advantage as that of the fourth aspect can be provided.

According to an A/D-converted output data correction method in accordance with an eleventh aspect, the order n of a functional equation is set to 2. Consequently, since a quadratic functional equation is adopted as a correctional equation, correction can be optimally achieved.

BRIEF DESCRIPTION OF THE DRAWINGS

Other objects, features and characteristics of the present invention will be appreciated and become apparent to those of ordinary skill in the art and all of which form a part of the present application. In the drawings:

FIG. 4 is a tabular list illustrating reference voltages to be designated according to divisions of an input voltage range;

FIG. 12 is a tabular list illustrating reference voltages to be designated according to divisions of an input voltage range associated with FIG. 11;

FIG. 20 is a tabular list illustrating exemplary data values stored in a ROM;

FIG. 24 is a tabular list illustrating reference voltages to be designated according to divisions of an input voltage range in accordance with an eighth embodiment;

DETAILED DESCRIPTION OF THE EXEMPLARY EMBODIMENTS

First Embodiment

Figure 1:
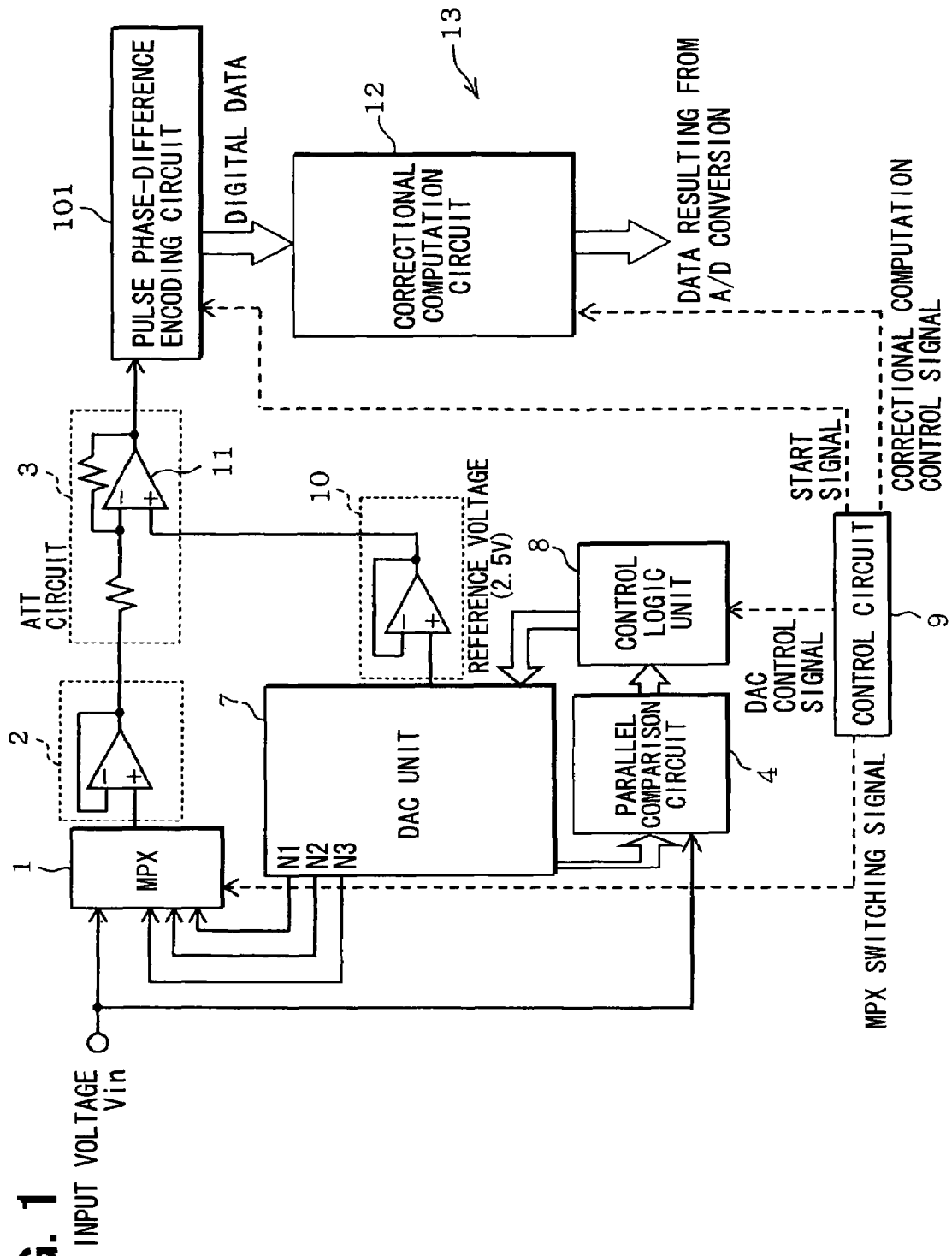
FIG. 1 is a block diagram illustrating configurations of an exemplary A/D conversion circuit and an exemplary data correction device in accordance with a first embodiment.
Figure 2:
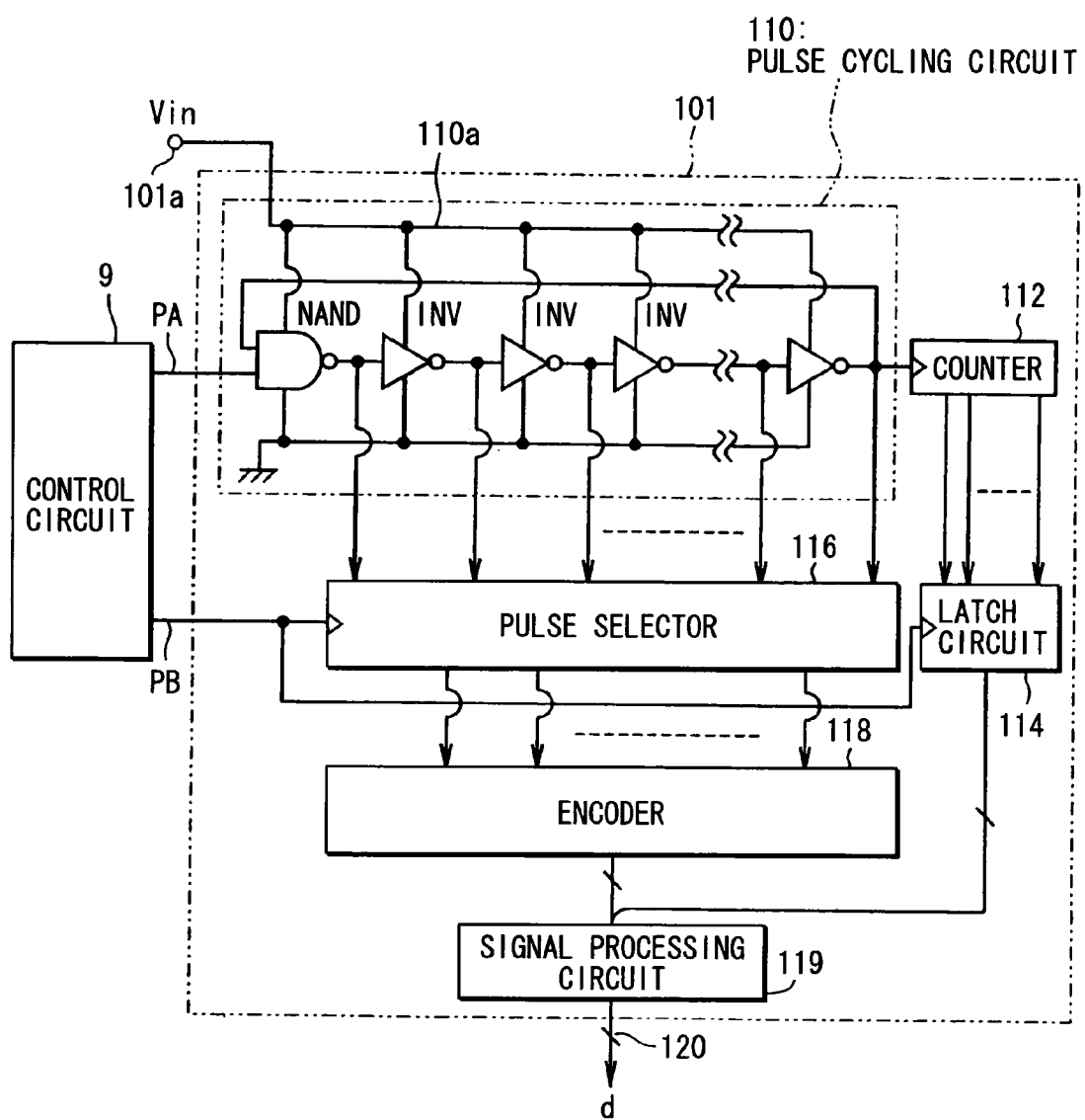
FIG. 2 is a diagram illustrating the detailed configuration of an exemplary pulse phase-difference encoding circuit.

Referring to the figures from FIG. 1 to FIG. 7, a first embodiment is described herein below. FIG. 1 shows an A/D conversion circuit and an output data correction device. The A/D conversion circuit includes a pulse phase-difference encoding circuit 101 identical to that shown described in connection with JP-A-2005-45538. The pulse phase-difference encoding circuit 101 encodes a phase difference between input pulses PA and PB that are input from a control circuit 9, which can operate for example as an input selecting means.

A pulse cycling circuit 110, which can be configured for example, as a ring gate delay circuit, includes a startup NAND gate which operates in response to the pulse signal PA applied to one input terminal thereof, and numerous inverter (INV) gates, which serve as reversal circuits, of which four INV gates are illustrated for simplicity. Since the NAND gate is provided at the beginning of the inversion stages creating an odd number of inversions, the overall operation of the circuits is to effect an inversion. Further, a NAND gate could be provided after the even number of INV stages such that the effect of a signal inversion can be preserved as will be understood and appreciated by one of ordinary skill. A counter 112 counts the number of times a pulse signal cycles in the ring gate delay circuit 110 by checking the number of times an output level is reversed by the INV gates disposed in the stage preceding the NAND gate in the ring gate delay circuit 110. The counter 112 generates digital data associated with the count, which is latched by a latch circuit 114.

A pulse selector 116 fetches the outputs of the reversal circuits or INV gates included in the ring gate delay circuit 110, samples a pulse signal cycling in the ring gate delay circuit 110, and generates a signal indicating the position of the pulse signal on the basis of the output levels. An encoder 118 generates digital data proportional to the output signal of the pulse selector 116.

A signal processing circuit 119 receives digital data sent from the latch circuit 114 as a high-order bit, and receives digital data sent from the encoder 118 as a low-order bit, and produces digital data d representing a phase difference between the pulse signals PA and PB. The digital data d produced by the signal processing circuit 119 is transmitted to outside over a data output line 120. The latch circuit 114 and pulse selector 116 operate in response to the pulse signal PB sent from the control circuit 9. The operation of the pulse phase-difference encoding circuit 101 is described in JP-A-2005-45538.

Figure 3:
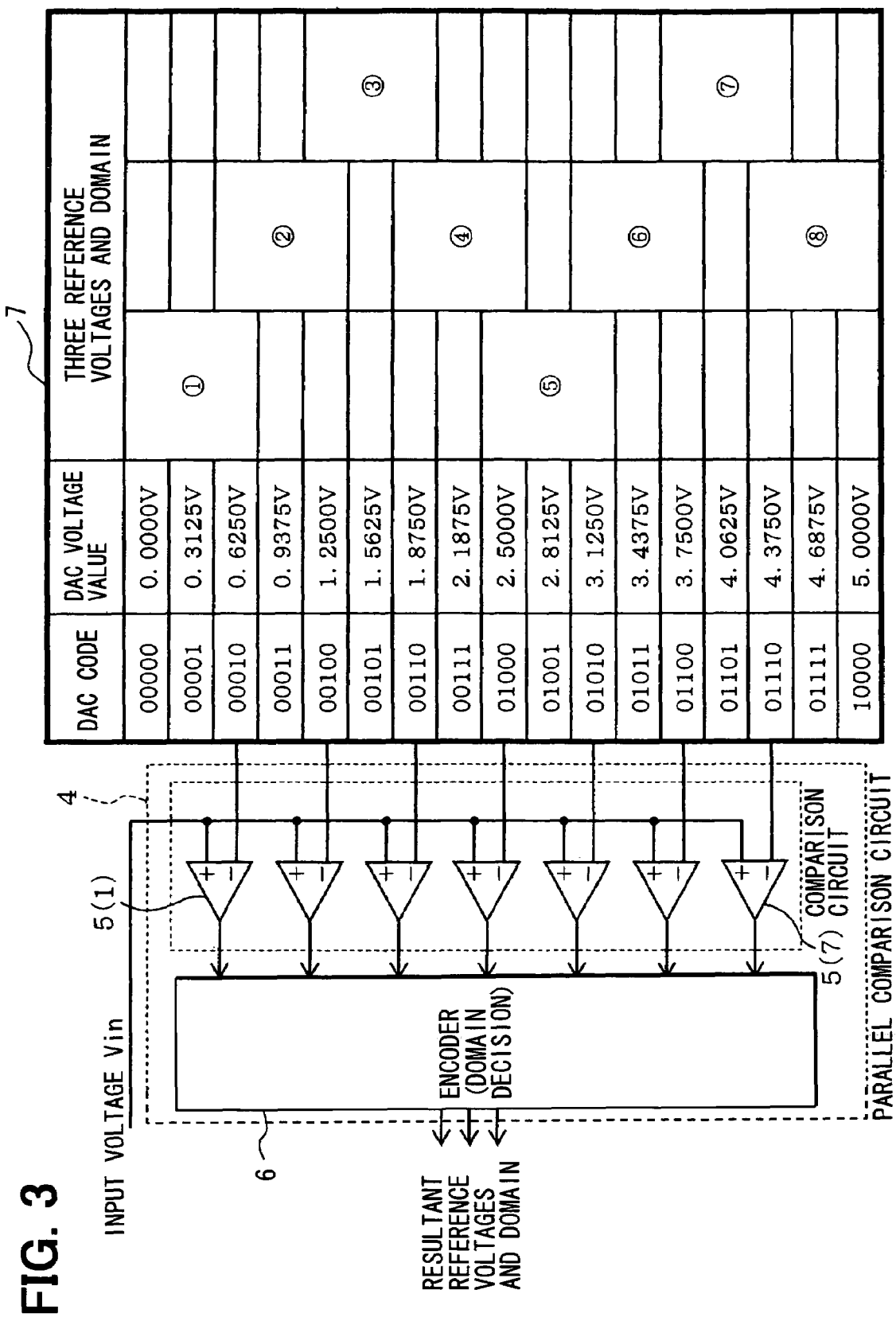
FIG. 3 is a diagram illustrating the detailed configuration of a exemplary parallel comparison circuit.

Referring back to FIG. 1, an input voltage Vin is applied to the input terminal 101a of the pulse phase-difference encoding circuit 101 via a multiplexer (MPX) 1, which can function as an input selecting means, a buffer 2, and an attenuation (ATT) circuit 3. The input voltage Vin is also input to a parallel comparison circuit 4, which can function as a deciding means. The parallel comparison circuit 4 includes, as shown in FIG. 3, seven comparators 5(1) to 5(7) and an encoder 6. The input voltage Vin is applied to the positive terminals of the respective comparators 5. Reference voltages of seven levels sent from a digital-to-analog conversion (DAC) unit 7 are applied to the respective negative terminals of the respective comparators 5.

The DAC unit 7, which can function as a reference voltage designating means includes a digital-to-analog (D/A) conversion circuit and peripheral logic circuits. Herein, a voltage domain to which the input voltage Vin belongs is supposed to range from 0 V to 5 V. While converted data is represented by 5 bits, for transmission of 5 V at a resolution of 4 bits, the DAC unit 7 transmits comparison reference voltages determined in units of 0.6250 V to the comparators 5(1) to 5(7) included in the parallel comparison circuit 4, as described in Table 1 below.

TABLE 1

| Comparator | Comparison reference voltage |
| --- | --- |
| 5(1) | 0.6250 V |
| 5(2) | 1.2500 V |
| 5(3) | 1.8750 V |
| 5(4) | 2.5000 V |
| 5(5) | 3.1250 V |
| 5(6) | 3.7500 V |
| 5(7) | 4.3750 V |

Specifically, the input voltage domain ranging from 0 V to 5 V is divided into eight domains at intervals of 0.6250 V by the seven comparators 5(1) to 5(7). The encoder 6 encodes a signal level (7-bit data) provided by the seven comparators 5(1) to 5(7), and transmits a 3-bit code to a control logic unit 8, the code indicating a voltage domain to which the input voltage Vin belongs.

The control logic unit 8, which can operate as a reference voltage designating means, transmits digital-to-analog conversion (DAC) data to the DAC unit 7. The conversion data is used to select three reference voltages N1, N2, and N3 according to the 3-bit code input from the parallel comparison circuit 4, that is, the voltage domain to which the input voltage Vin belongs. The relationship among the eight voltage domains indicated with encircled numerals in FIG. 3, and three reference voltages N1, N2, and N3 will be described below in greater detail in connection with FIG. 4.

For example, a voltage domain (1) ranges from 0.0000 V to 0.6250 V. The voltages at the limits of the domain are selected as the voltages N3 and N1, and an intermediate voltage of 0.3125 V of the domain is selected as the voltage N2. The next voltage domain (2) ranges from 0.6250 V to 1.2500 V. The voltages at the limits of the domain are selected as the voltages N3 and N1, and an intermediate voltage of 0.9375 V of the domain is selected as the voltage N2. Likewise, the voltages defining the upper and lower limits of each of the other voltage domains (3) to (8), and an intermediate voltage are selected as the reference voltages N1, N2, and N3.

Consequently, when a 3-bit code input from the parallel comparison circuit 4 is 000 to designate the voltage domain (1), the control logic unit 8 sequentially transmits 5-bit DAC data values of 00000, 00001, and 00010 associated with the three selected reference voltages N1, N2, and N3 to the DAC unit 7. The DAC unit 7 simultaneously transmits analog reference voltages N1, N2, and N3 obtained by digital-to-analog (D/A)-converting the received DAC data values to the multiplexer 1. Selection of an input by the multiplexer 1 and control of the timing of the control logic unit 8 are achieved by the control circuit 9.

Moreover, the DAC unit 7 generates a reference voltage of 2.5 V, and applies the reference voltage to the positive terminal of an operational amplifier 11 included in the ATT circuit 3. When the input voltage Vin ranges from 0 V to 5 V, the ATT circuit 3 reverses and amplifies the input voltage at a gain of ⅕, and applies the resultant voltage to the input terminal 101a of the pulse phase-difference encoding circuit 101. The reference voltage of 2.5 V is regarded as a reference for reversal and amplification. Since a voltage domain that the pulse phase-difference encoding circuit 101 can A/D-convert is narrower than 5 V, such as, for example, about 2 V to 3 V, the input voltage is regulated to fall within the convertible voltage domain. It should be noted that while a reversal and amplification circuit is constructed so that a gain value can be readily designated, a non-reversal and amplification circuit may be alternately be constructed.

Digital data resulting from A/D-conversion performed by the pulse phase-difference encoding circuit 101 is corrected based on a quadratic functional equation in which n=2, by the correctional computation circuit 12, which can function as a correctional equation determining means and correcting means. The corrected data is then transmitted. Control of the timing of the correctional computation circuit 12 is performed by the pulse phase-difference encoding circuit 101 and control circuit 9. The aforesaid components other than the buffers 2 and 10, attenuation circuit 3, and pulse phase-difference encoding circuit 101 constitute an output data correction device 13.

Figure 5:
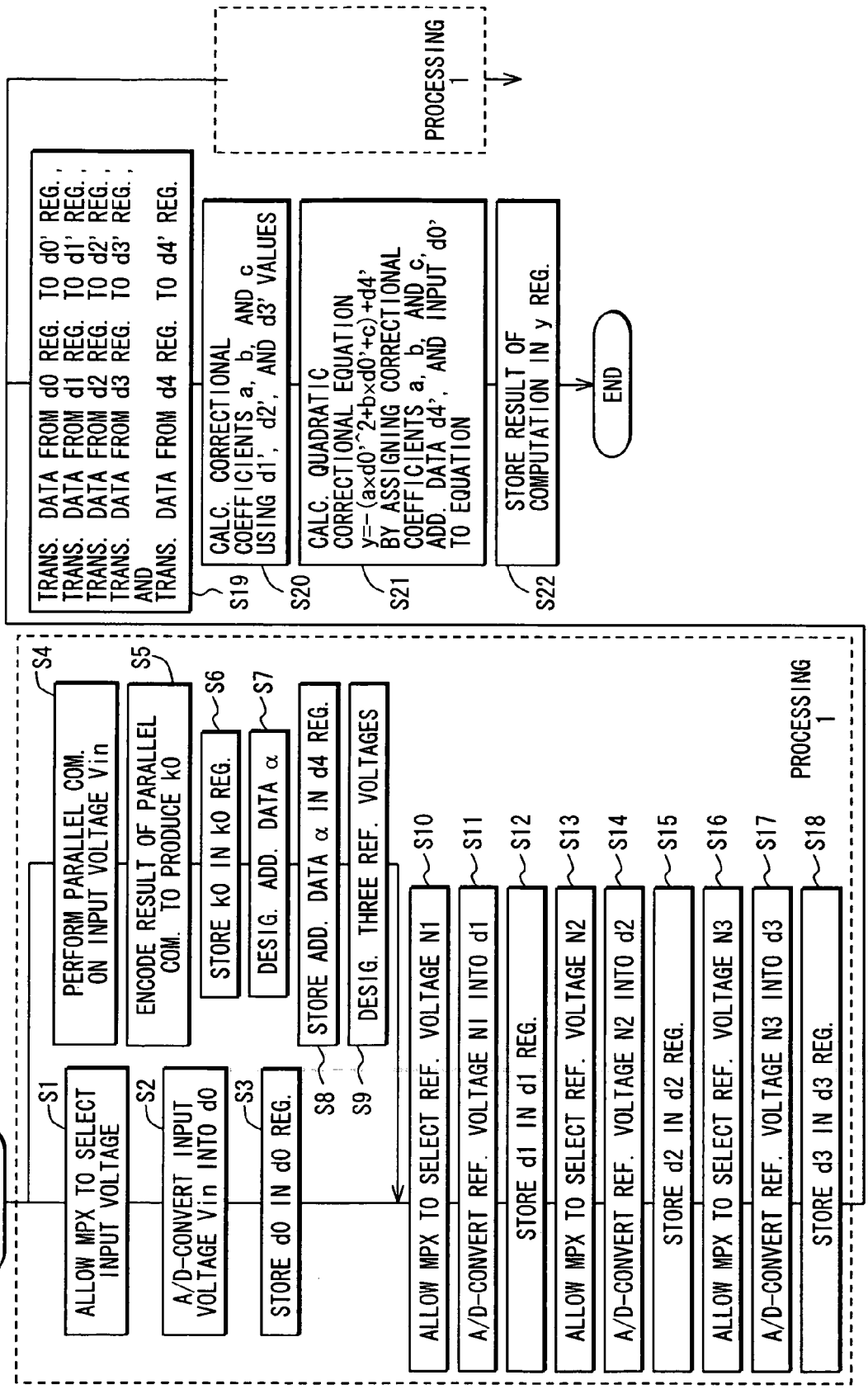
FIG. 5 is a flowchart illustrating exemplary processing performed by an output data correction device.
Figure 6:
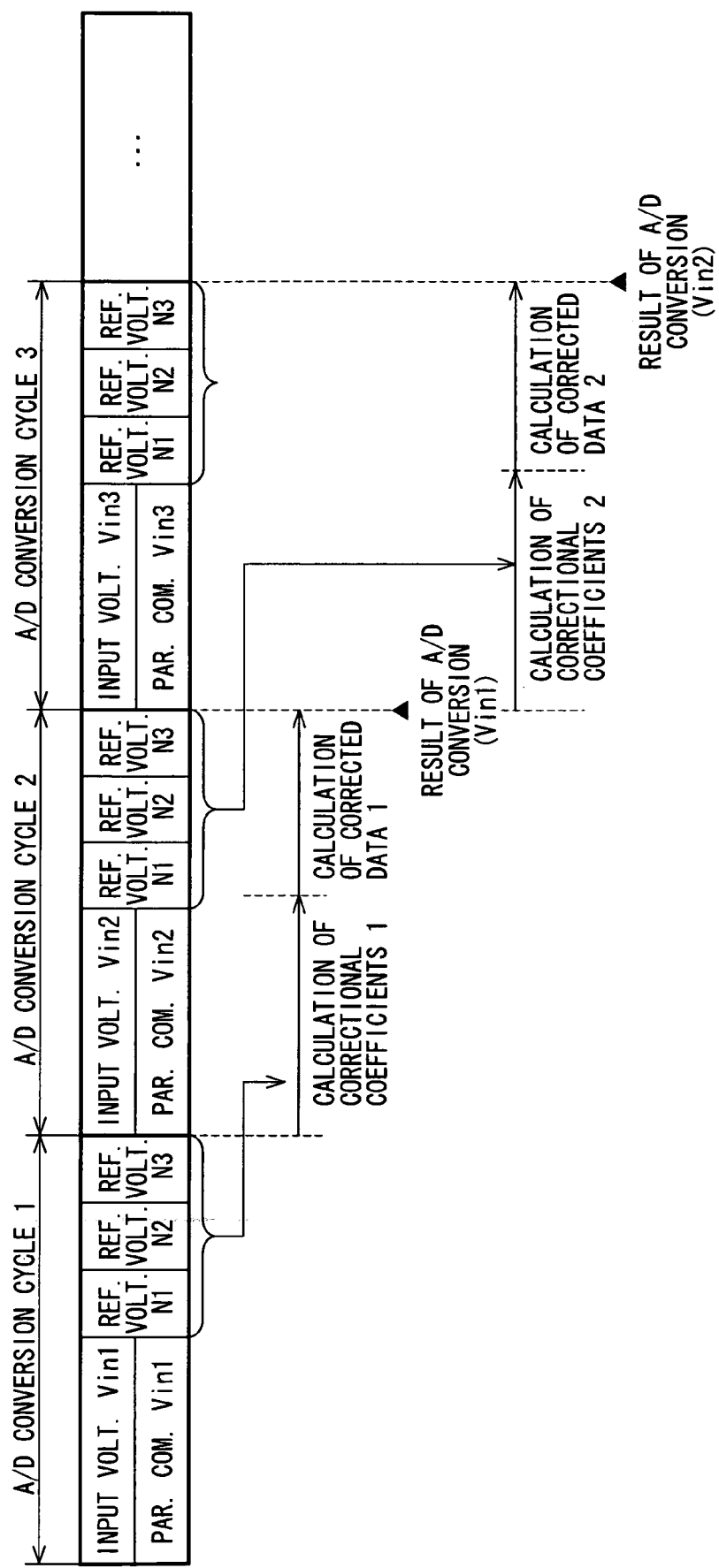
FIG. 6 is a timing chart illustrating exemplary timing associated with the processing of FIG. 5.

Next, an operation will be described with reference to the figures from FIG. 5 to FIG. 7. FIG. 5 is a flowchart describing exemplary processing performed by the output data correction device 13. FIG. 6 is a timing chart relating to the flowchart of FIG. 5. The control circuit 9 enables the multiplexer 1 to select the input voltage Vin at S1, enables the pulse phase-difference encoding circuit 101 to execute A/D conversion at S2, and enables the correctional computation circuit 12 to hold converted data d0 in an internal d0 register at S3.

S4 to S9 constitute processing to be executed by the parallel comparison circuit 4 and control logic unit 8 in parallel with the processing from S1 to S3. The parallel comparison circuit 4 uses the seven comparators 5 thereof to compare the input voltage Vin with the designated voltages at S4. The result of the comparison is encoded in order to transmit a 3-bit code k0 at S5. The control logic unit 8 stores the code k0 in a k0 register at S6.

Next, the control logic unit 8 designates addition data α at S7, and stores the addition data α in a d4 register at S8. When three reference voltages N1, N2, and N3 are selected, the DAC unit 7 transmits the reference voltages N1, N2, and N3 at S9. Incidentally, the addition data α is appended to A/D-converted data in order to transmit 16-bit continuous data (from −32768 to 32767). Namely, the input voltage Vin is classified into any of eight domains, with the width of each domain being represented by a data value of 8192. The input voltage Vin is A/D-converted with 2.5 V as a reference. The boundary values of the domain starting with 2.5 V are ±4096.

Thereafter, the control circuit 9 enables the multiplexer 1 to select the reference voltage N1 output from the DAC unit 7 at S10. The pulse phase-difference encoding circuit 101 A/D-converts the reference voltage N1 to data d1 at S11. The correctional computation circuit 12 stores the data d1 in the d1 register at S12. At S13 to S15 and S16 to S18, the reference voltages N2 and N3 are A/D-converted in the above described manner, and converted data values d2 and d3 are stored in the d2 and d3 registers respectively constituting processing (1) as indicated with an encircled numeral in FIG. 5.

Thereafter, the correctional computation circuit 12 transfers the contents of the d0 to d4 registers to d0' to d4' registers at S19. It should be noted that transfer from the d4 register to the d4' register involves the control logic unit 8 and correctional computation circuit 12. Based on the data values d1 to d3, coefficients a, b, and c included in a correctional equation to be used to correct converted data d0 of the input voltage Vin are determined at S20. In other words, the coefficients used in association with a quadratic functional equation for correction, as described in greater detail below, are calculated, determined or otherwise worked out. As shown in FIG. 5, equation (1) can be defined on the assumption that data values in the d0' and d4' registers are employed.

$$y = -\{a \times d0^2 + b \times d0 + c\} + \alpha \qquad (1)$$

A minus sign is included in equation (1) since the ATT circuit 3 performs reversal and amplification. The correctional coefficients a, b, and c are calculated according to equations (2) to (4) presented below.

$$\text{coefficient } a = \frac{4096}{N3 - N1} \times \left( \frac{1}{N3 - N2} - \frac{1}{N2 - N1} \right) \qquad (2)$$

$$\text{coefficient } b = \frac{4096}{N3 - N1} \times \left( \frac{N3 + N2}{N2 - N1} - \frac{N2 - N1}{N3 - N2} \right) \qquad (3)$$

$$\text{coefficient } c = -a \times (N2 \times N2) - b \times N2 \qquad (4)$$

Thereafter, the correctional computation circuit 12 computes or corrects the converted data d0 of the input voltage Vin according to equation (1) at S21. The result of the computation, y, is stored in a y register at S22. The procedure terminates. When another input voltage Vin is successively A/D-converted, the processing (1) for correcting the next A/D-converted data is executed in parallel with the processing from S17 to S20.

Specifically, as shown in FIG. 6, in the first A/D conversion cycle 1, in parallel with A/D conversion of an input voltage Vin1 at S1 to S3, the input voltage Vin1 is compared with the designated values in order to decide to which of eight domains the input voltage belongs at S4 to S9. Thereafter, the reference voltages N1, N2, and N3 are successively A/D-converted at S10 to S18. In the next A/D conversion cycle 2, in parallel with the above described processing performed on an input voltage Vin2, the correctional coefficients a, b, and c for use in correcting the input voltage Vin1 are calculated, and corrected data y is calculated. At the end of the A/D conversion cycle 2, the corrected data y of the input voltage Vin1 is obtained at S19 to S22. As mentioned above, the processing from S1 to S18 and the processing from S19 to S22 are executed according to a pipelining method.

Figure 7A:
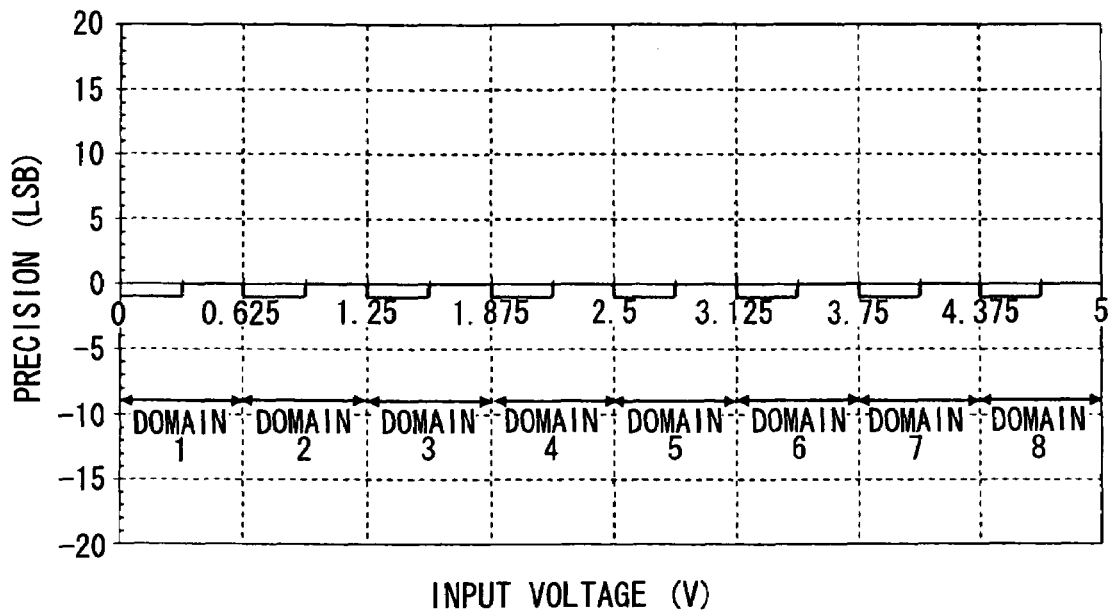
FIG. 7A is a graph illustrating a non-linear error occurring when an exemplary correction method in accordance with a first embodiment is adopted.
Figure 7B:
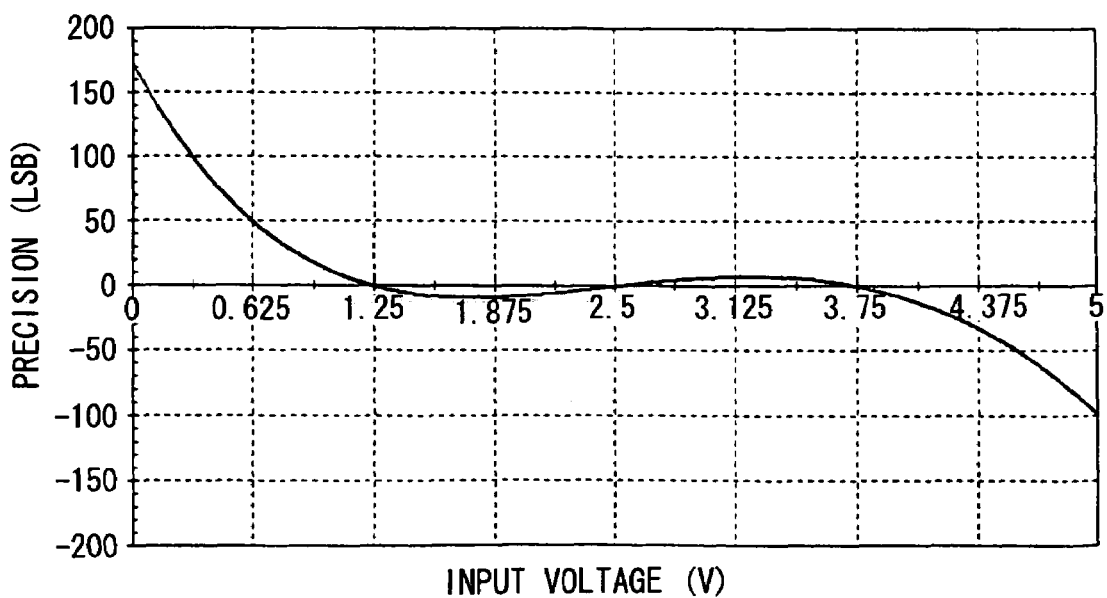
FIG. 7B is a graph illustrating a non-linear error occurring when prior art correction methods are adopted.

FIG. 7A shows a non-linear error occurring when a correction method in accordance with the present invention is adopted, and FIG. 7B shows a non-linear error occurring when conventional correction methods, such as described in JP-A-2005-45538 are adopted. In accordance with the conventional method, three reference voltages 1.25 V, 2.5 V, and 3.75 V are selected relative to an input voltage ranging from 0 to 5 V, and correction is performed. As the input voltage gets closer to the lower limit or upper limit, an error increases such as from 170 LSB to −100 LSB. Therefore, correction in accordance with the conventional method cannot be said to be performed adequately.

In contrast, according to various embodiments described herein, results of which are shown in FIG. 7A, an error is −1 LSB over the voltage domains (1) to (8). Thus, the error is very small, and correction that provides highly precise linearity is achieved.

As mentioned above, according to the present embodiment, the parallel comparison circuit 4 decides to which of eight domains, into which an estimated maximum input range from 0 to 5 V is divided, a voltage Vin input to the pulse phase-difference encoding circuit 101 belongs. The control logic unit 8 and DAC unit 7 select and transmit at least three reference voltages N1 to N3 associated with the selected domain.

When the control circuit 9 enables the multiplexer 1 to select each of the reference voltages, the correctional computation circuit 12 computes and determines a quadratic functional equation whose graph passes coordinate points representing the three reference voltages N1 to N3, in a two-dimensional coordinate system in which the axis of ordinates indicates reference voltages and the axis of abscissas indicates A/D-converted data values. When the multiplexer 1 selects an input voltage, A/D-converted data is corrected using a quadratic functional equation associated with a domain to which the input voltage Vin is decided to belong. Consequently, correction can be achieved highly precisely over all the input voltage domains, and a linear conversion characteristic can be provided.

An A/D conversion circuit whose output is to be corrected by the output data correction device 13 is realized with the pulse phase-difference encoding circuit 101 including the ring gate delay circuit 110 and counter 112. Namely, fluctuations in supply voltage cause a signal propagation delay through the reversal circuits constituting the ring gate delay circuit 110 to vary non-linearly further causing the A/D conversion characteristic of the pulse phase-difference encoding circuit 101 to be markedly non-linear. The present invention can be very effectively applied to alleviate or mitigate the nonlinearity in the A/D conversion circuit.

Every time the pulse phase-difference encoding circuit 101 A/D-converts an input voltage Vin, the output data correction device 13 determines a correctional equation so as to correct A/D-converted data. Consequently, the data can be corrected with high precision.

Second Embodiment

Figure 8:
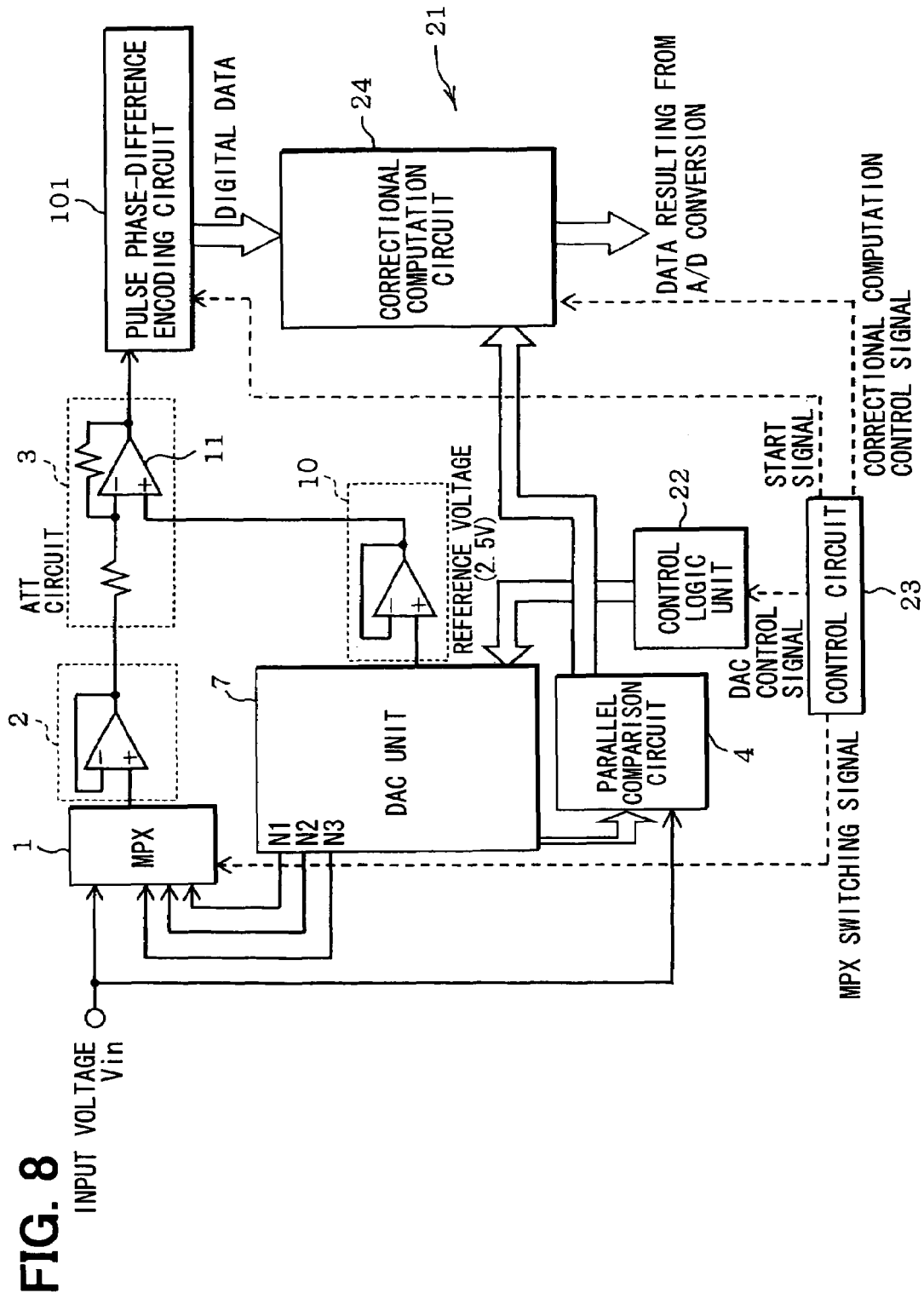
FIG. 8 is a block diagram illustrating configurations of an exemplary A/D conversion circuit and an exemplary data correction device in accordance with a second embodiment.
Figure 9:
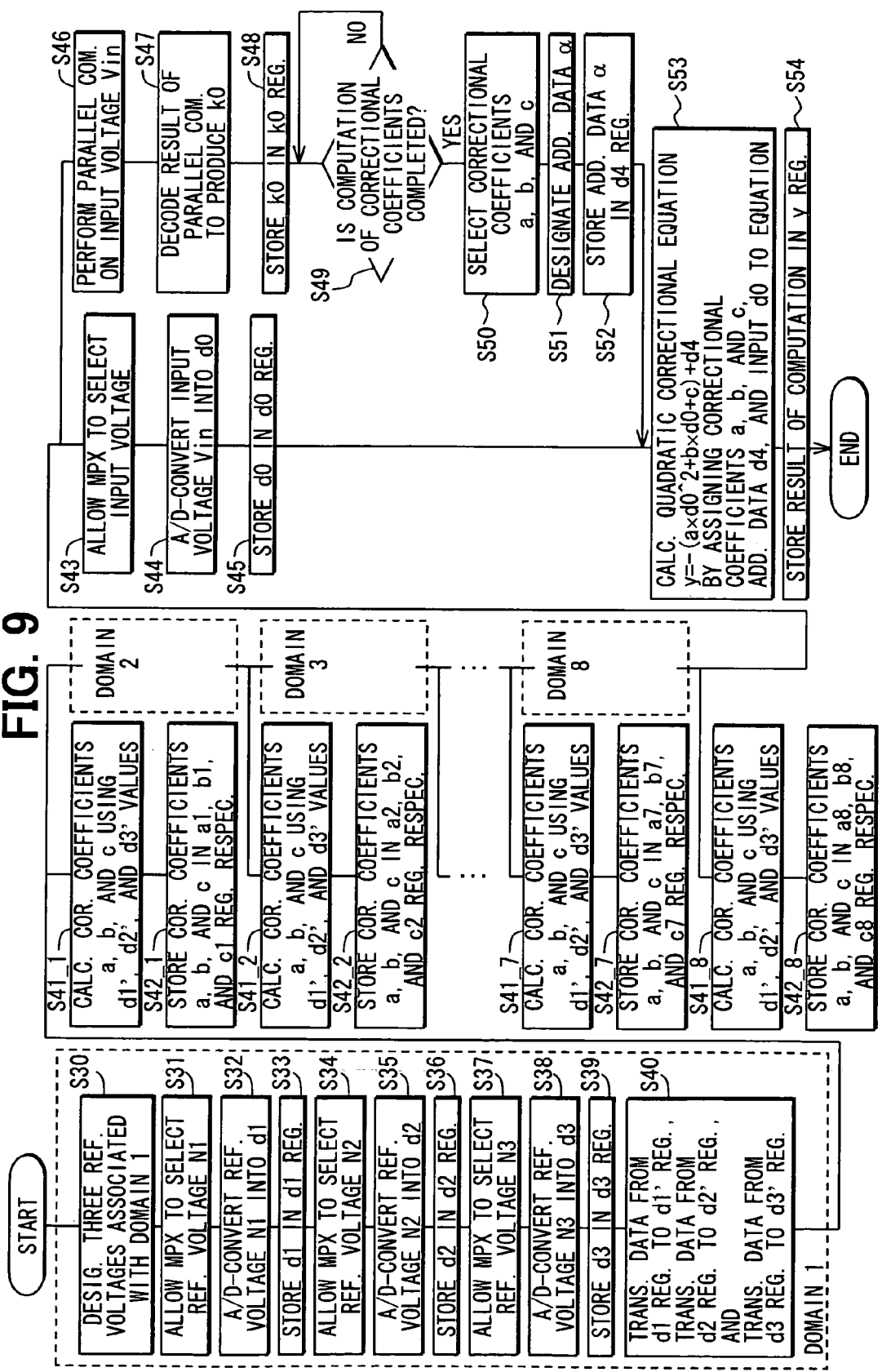
FIG. 9 is a flowchart illustrating alternative exemplary processing performed by an output data correction device.
Figure 10:
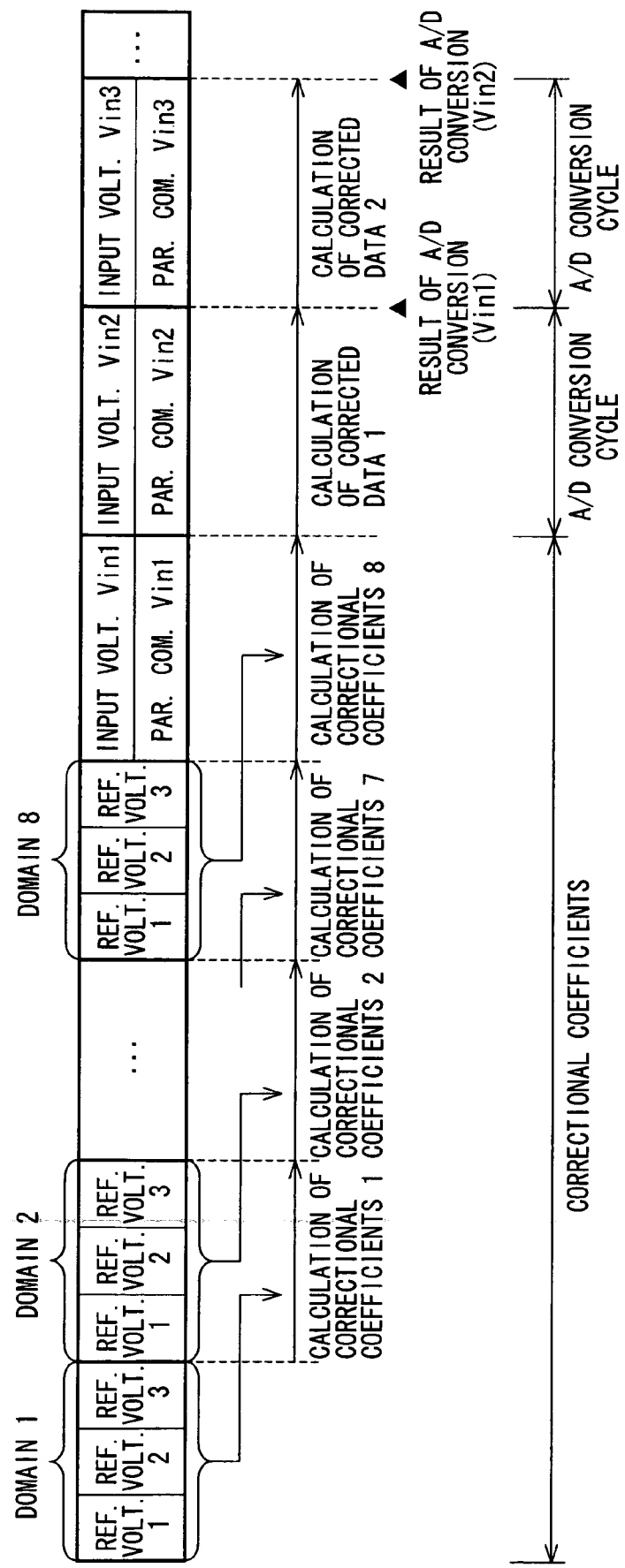
FIG. 10 is a timing chart illustrating exemplary timing associated with the processing of FIG. 9.
Figure 11:
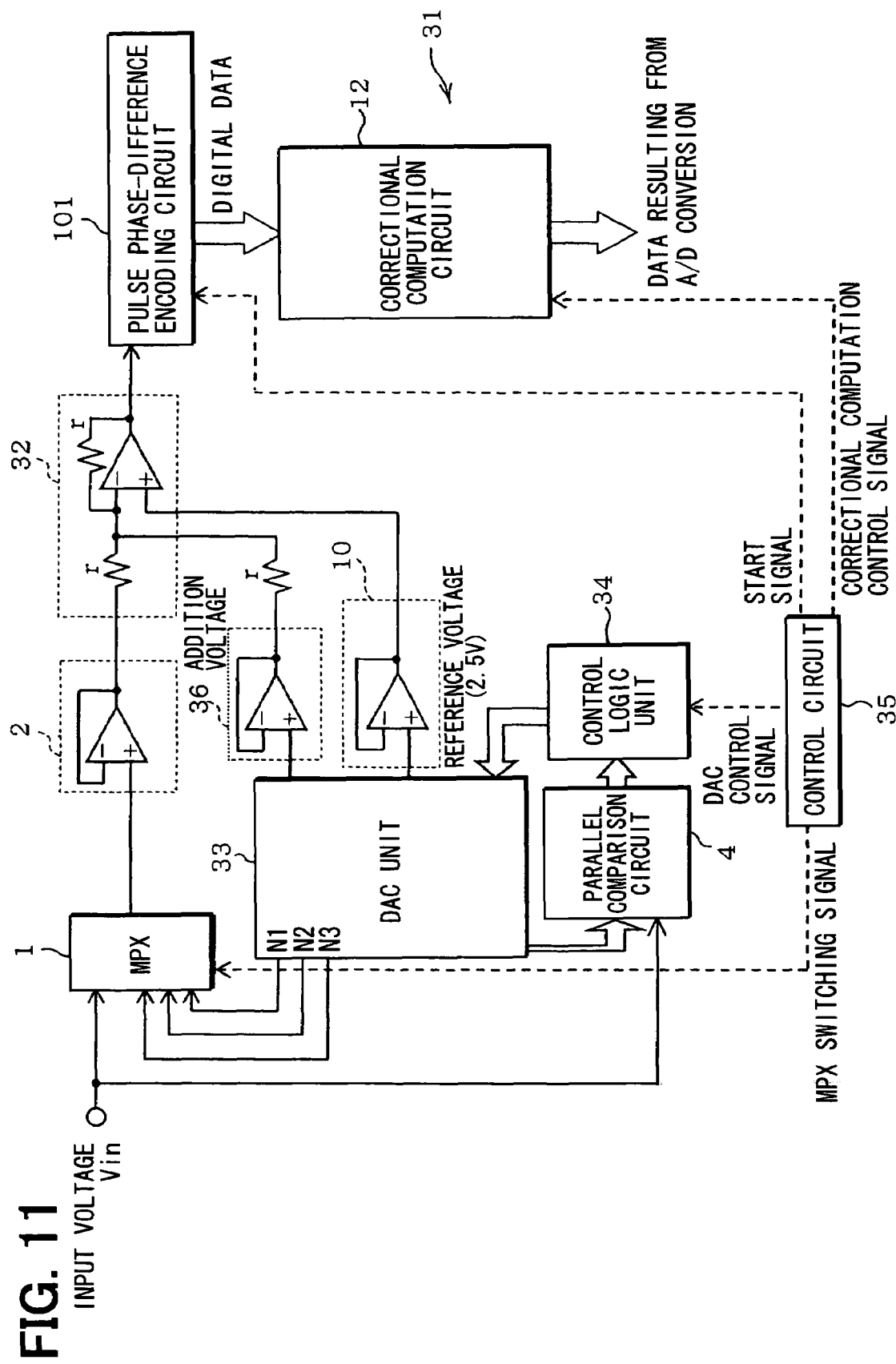
FIG. 11 is a block diagram illustrating configurations of an exemplary A/D conversion circuit and an exemplary data correction device in accordance with a third embodiment.

FIG. 8 to FIG. 10 show configurations in accordance with a second embodiment. For simplicity of description, components described using reference numerals already described hereinabove or components whose descriptions have been omitted are identical to those of the first embodiment. Thus differences from the first embodiment will primarily be described below.

Every time an input voltage Vin is A/D-converted, the output data correction device 13 in accordance with the first embodiment calculates the correctional equations a, b, and c in accordance with equation (1). In contrast, an output data correction device 21 in accordance with the second embodiment calculates the correctional equations a, b, and c in relation to each of the eight domains to which the input voltage Vin would belong, and utilizes the calculated correctional coefficients for correctional calculation.

In FIG. 8, the control logic unit 8, control circuit 9, and correctional computation circuit 12 are replaced with a control logic unit 22, a control circuit 23, and a correctional computation circuit 24 respectively. A 3-bit code sent from the parallel comparison circuit 4 is transmitted to the correctional computation circuit 24 instead of the control logic unit 22.

Next, an operation of the second embodiment will be described with reference to FIG. 9 and FIG. 10. In FIG. 9, at S40, unlike the first embodiment, transfer of data from the d0 and d4 registers is not carried out. At S31, the control logic unit 22 designates data used to transmit the three reference voltages N1, N2, and N3 associated with the voltage domain (1), to the DAC unit 7. At S42, the correctional coefficients a, b, and c associated with the voltage domain (1) are stored in a1, b1, and c1 registers respectively.

The above described processing is concerned with the voltage domain (1). For the voltage domains (2) to (8), the control logic unit 22 performs the same processing to set data in the DAC unit 7 while switching the voltage domains (2) to (8). The processing for the domain (2) shown in FIG. 9 is executed in parallel with the processing of S41_1 and S42_1 relating to the domain (1). At S42_2 relating to the domain (2), the correctional coefficients a, b, and c are stored in a2, b2, and c2 registers respectively.

When the S40 relating to the domain (8) is completed, the control circuit 23 performs the same processing as the processing from S1 to S6 performed in the first embodiment, at S43 to S48. At S49, a standby state is retained until the processing of S41_8 and S42_8 concerning the domain (8) is completed. When the processing is completed, corresponding to YES at S49, the correctional computation circuit 24 selects the correctional coefficients a, b, and c associated with the voltage domain to which the input voltage Vin belongs at S50. At S51 to S54, the same processing as the processing of S7, S8, S21, and S22 is carried out.

FIG. 10 is a timing chart concerning the procedure of FIG. 9. To begin with, three reference voltages associated with each of the voltage domains (1) to (8) are selected, and the correctional coefficients a, b, and c are calculated. A/D conversion of the input voltage Vin, comparison and decision of a domain to which the input voltage Vin belongs, and correctional calculation of A/D-converted data are performed successively.

As mentioned above, according to the second embodiment, the control circuit 23 selects each of reference voltages as a signal to be input to the pulse phase-difference encoding circuit 101. The DAC unit 7 sequentially selects and transmits the reference voltages associated with each of eight voltage domains. The correctional computation circuit 24 sequentially determines quadratic functional equations associated with the eight domains, and holds the functional data values.

Consequently, the predetermined correctional equations can be used to quickly correct A/D-converted data values.

Third Embodiment

FIG. 11 to FIG. 16 show exemplary configurations in accordance with a third embodiment. A difference from the first embodiment will be described below. In an output data correction device 31 according to the third embodiment, the ATT circuit 3 is replaced with a reversal buffer 32 that produces a gain 1.0. The DAC unit 7, control logic unit 8, and control circuit 9 are replaced with a DAC unit 33, which can function as a level converting means, a control logic unit 34, and a control circuit 35 respectively. The DAC unit 33 applies an addition voltage, which is associated with a voltage domain to which an input voltage Vin belongs, to the negative terminal of the reversal buffer 32 via a buffer 36, which can function as a level converting means.

Figure 13:
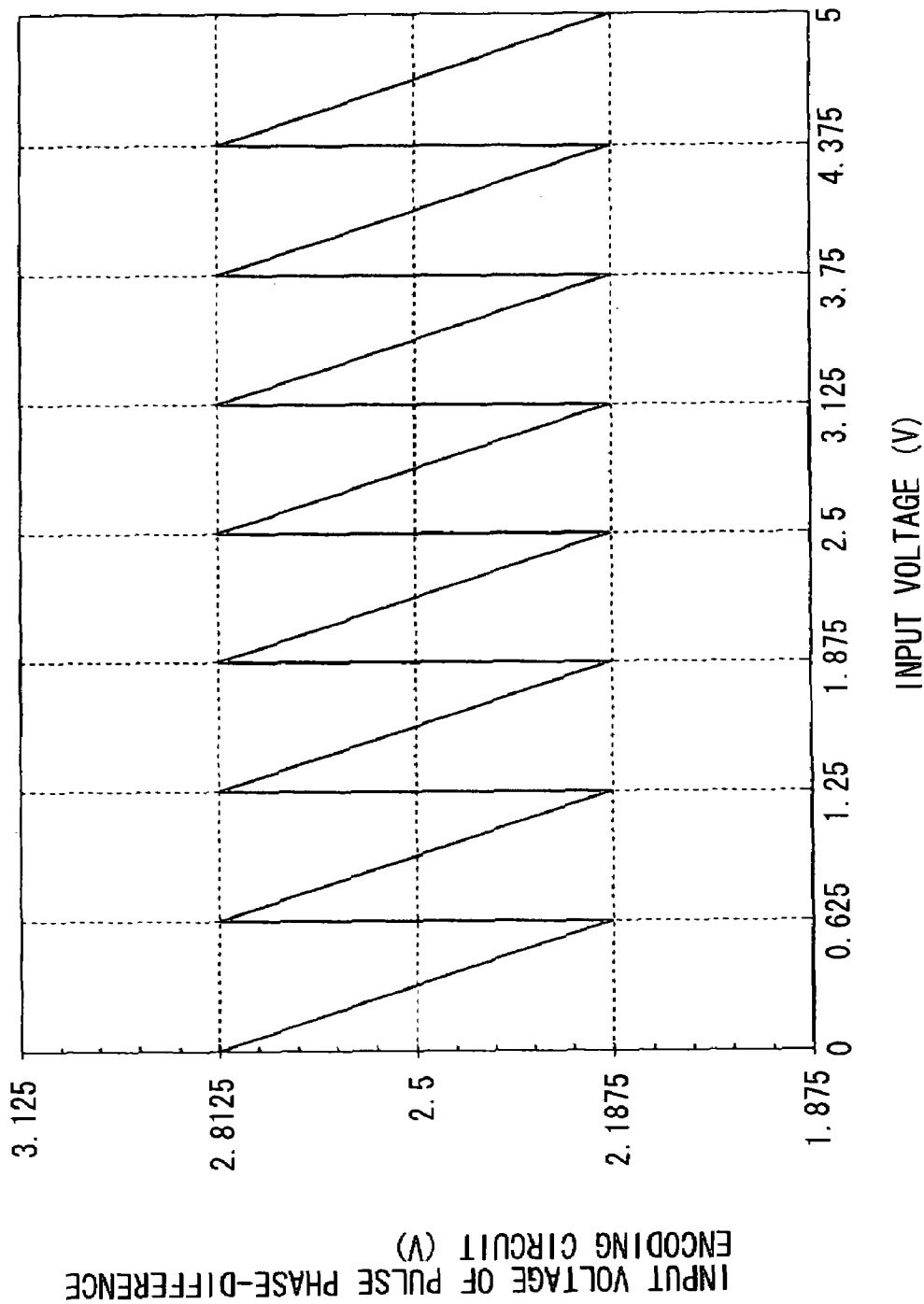
FIG. 13 is a graph illustrating an exemplary relationship between the values of an input voltage Vin and a range of values of a voltage directly applied to an input terminal of a pulse phase-difference encoding circuit.

As shown in FIG. 12 and FIG. 13, in accordance with the third embodiment, even when a voltage domain to which the input voltage Vin belongs changes, an addition voltage is varied in order to regulate the input voltage so that the input voltage to be input to the pulse phase-difference encoding circuit 101 will always fall within the same range. The three reference voltages N1, N2, and N3 to be used for correctional calculation are fixed to certain values.

Specifically, the control logic unit 34 and DAC unit 33 designate an addition voltage in association with each of the voltage domains (1) to (8) as presented in Table 2 shown below.

TABLE 2

| Voltage domain | Addition voltage |
| --- | --- |
| (1) | 4.6875 V |
| (2) | 4.0625 V |
| (3) | 3.4375 V |
| (4) | 2.8125 V |
| (5) | 2.1875 V |
| (6) | 1.5625 V |
| (7) | 0.9375 V |
| (8) | 0.3125 V |

Since the reference voltage held in the reversal buffer 32 is 2.5 V, an input voltage domain to which an input of the pulse phase-difference encoding circuit 101 belongs is always a range from 2.8125 V to 2.1875 V as shown in FIG. 13. Consequently, as three reference voltages, the reference voltages of one kind associated with the voltage domain (5) in the first embodiment should merely be prepared.

Figure 14:
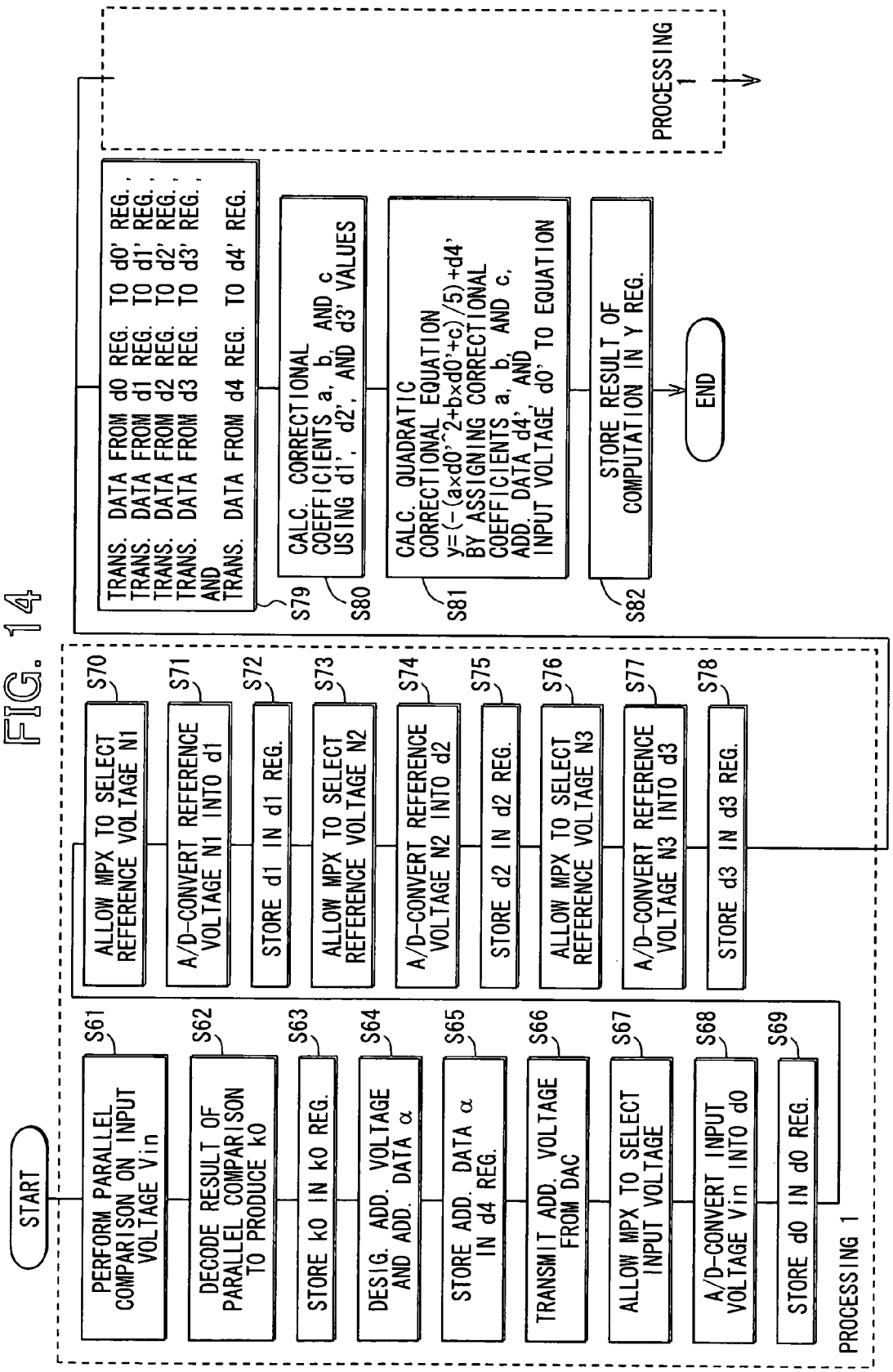
FIG. 14 is a flowchart illustrating alternative exemplary processing performed by an output data correction device.

Next, an operation of the third embodiment will be described with reference to FIG. 14 to FIG. 16 alike. In FIG. 14 that is an equivalent of FIG. 5, first, at S61 to S63, the same processing as the processing from S4 to S6 is carried out. After a voltage domain to which the input voltage Vin belongs is decided, addition data α and an addition voltage are designated based on the voltage domain at the next S64. The addition data α is stored in the d4 register at S65). The DAC unit 33 transmits the addition voltage to the buffer 36 at S66). Thereafter, the control circuit 35 performs the same pieces of processing as the processing from S1 to S3 and the processing from S10 to S22 at S67 and S82.

Herein, a correctional equation employed at S81 is the equation (5) presented below.

$$y = -\{a \times d0^2 + b \times d0 + c\}/5 + \alpha \quad (5)$$

A term of multiplication by ⅕ is added to the equation (1) to obtain a result of conversion similar to that obtained in the first embodiment. The multiplier is substituted for the gain ⅕ produced by the ATT circuit 3 included in the first embodiment. In such a case, the numerator 4096 in the first term on the right side of the equation (2) or (3) that provides the coefficient a or b is replaced with a quintuple that is 20480.

Moreover, similar to the first embodiment, S61 to S78 are regarded as the processing (1) to be performed on an input voltage Vin1, and the processing from S79 to S82 is executed in parallel with the processing (1) to be performed on the next input voltage Vin2.

Figure 15:
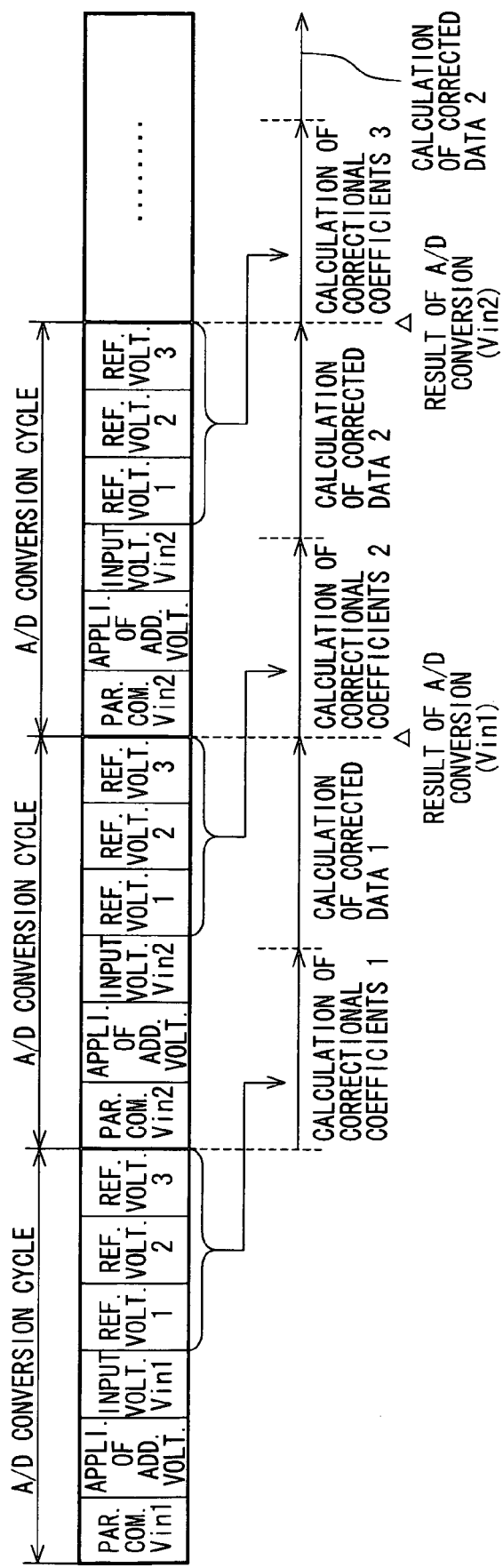
FIG. 15 is a timing chart illustrating alternative exemplary timing associated with the processing of FIG. 14.

FIG. 15 is a timing chart. In each A/D conversion cycle, a voltage domain to which an input voltage Vin belongs is decided, an addition voltage is designated, and the input voltage Vin is A/D-converted while the addition voltage is being transmitted from the DAC unit 33. Thereafter, the reference voltages N1, N2 and N3 are sequentially A/D-converted in order to obtain the correctional coefficients a, b, and c. Correctional calculation is then performed.

Figure 16:
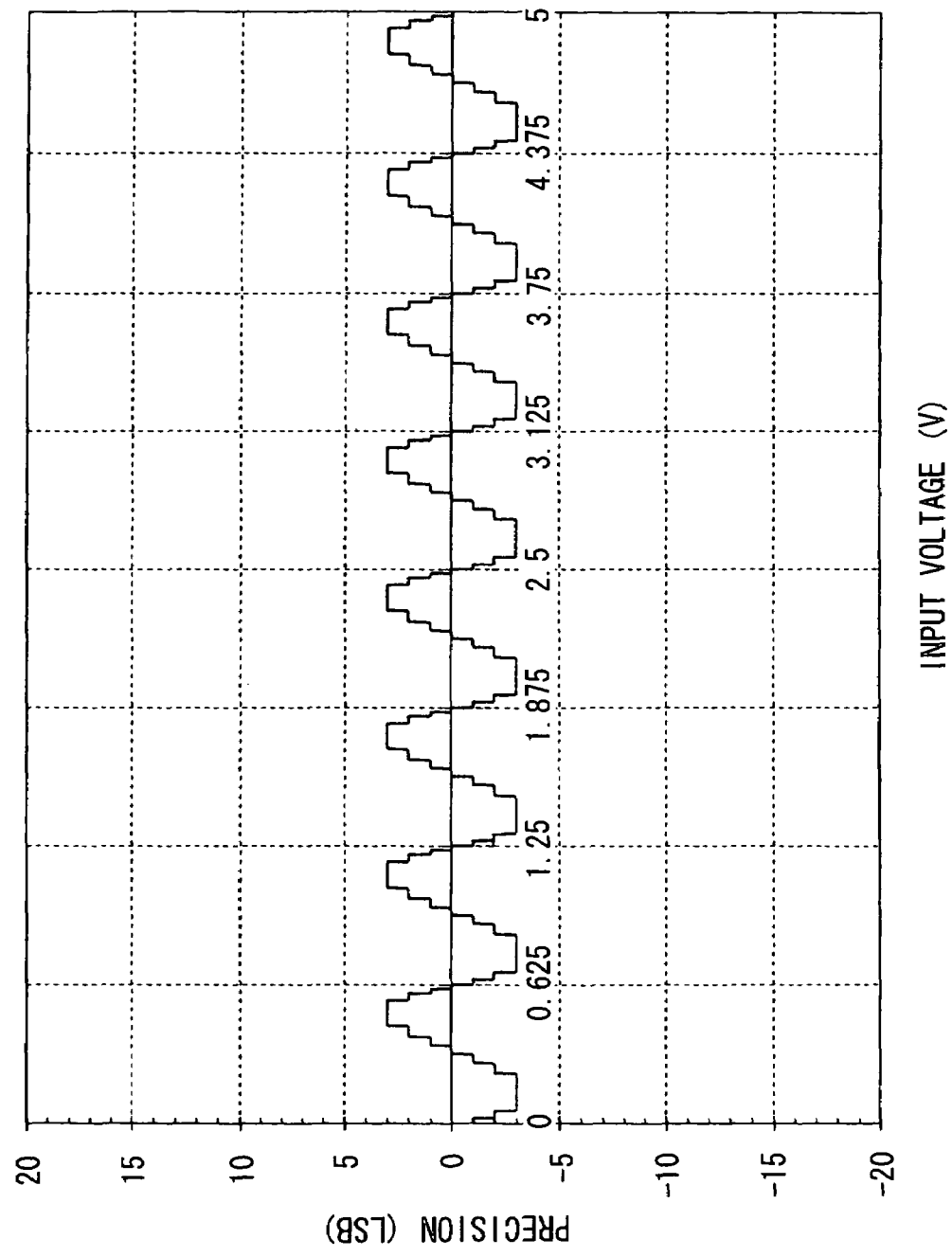
FIG. 16 is a graph illustrating a non-linear error occurring when an exemplary correction method in accordance with a first embodiment is adopted.

In FIG. 16 in accordance with a third embodiment, the precision in correction is slightly poorer than that in the first embodiment because the gain ⅕ produced used by the attenuation circuit 3 described above in connection with the first embodiment is not able to be used and instead the above described multiplier is used. Consequently, an error in correction is presumably directly reflected in the result of correction. However, the correctional precision has been improved largely compared with that guaranteed by the related art.

As mentioned above, according to the third embodiment, the DC unit 33 adds a regulation voltage associated with a voltage domain decided by the parallel comparison circuit 4, to an input voltage Vin so that the level of the input voltage to be input to and converted by the pulse phase-difference encoding circuit 11 will fall within a predetermined range. A correctional equation should merely be determined relative to the predetermined range, and correctional arithmetic processing can be alleviated.

Moreover, every time the pulse phase-difference encoding circuit 101 A/D-converts a new input voltage Vin, the control circuit 35 selects each of reference voltages. The correctional equation determining means newly computes a quadratic functional equation on the basis of A/D-converted data, that is, data resulting from the A/D conversion. Consequently, the correctional computation circuit 12 obtains a correctional equation on the basis of the result of conversion performed in the latest condition by the pulse phase-difference encoding circuit 101, and can therefore achieve highly precise correction using the correctional equation.

Fourth Embodiment

Figure 17:
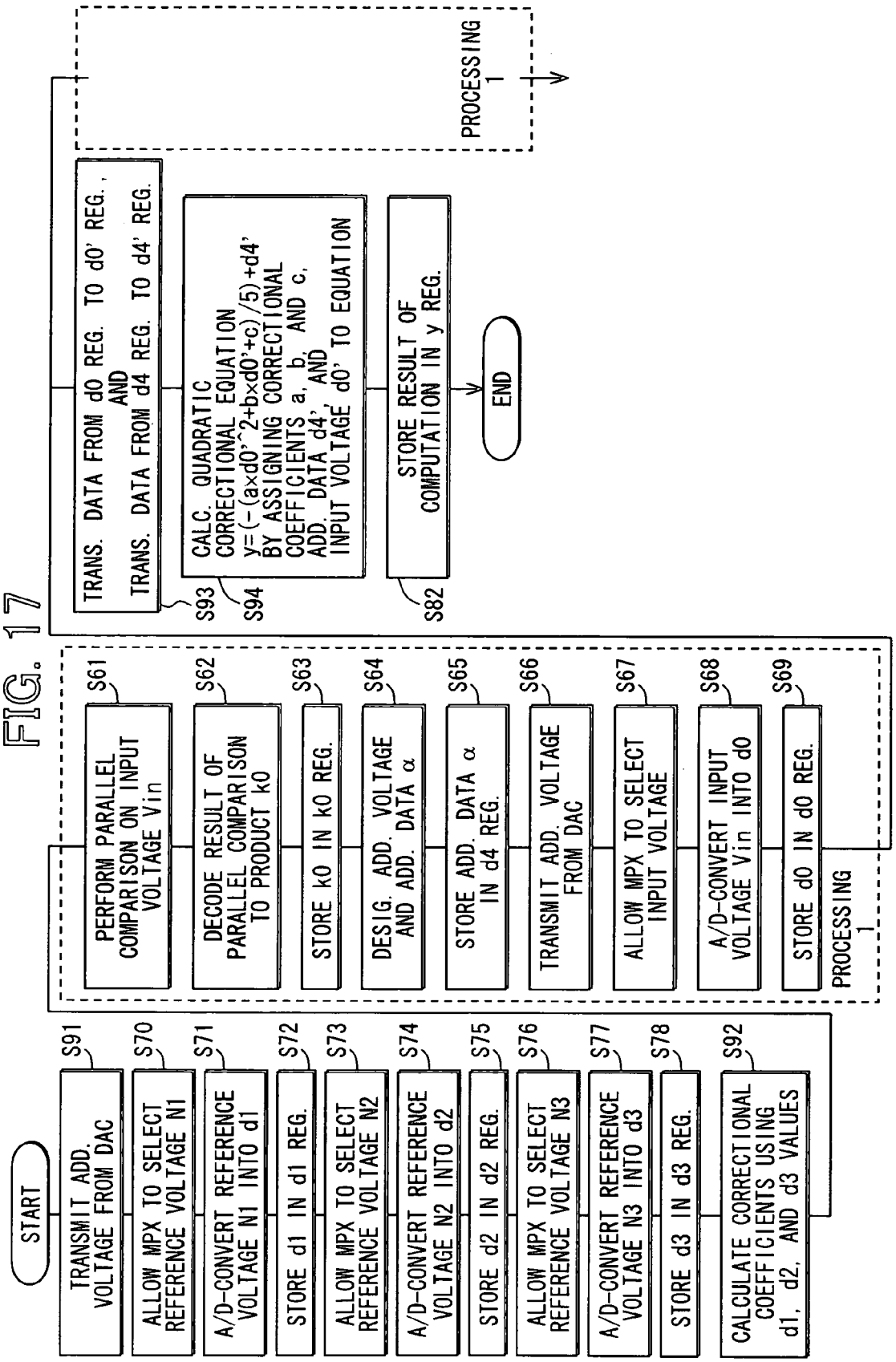
FIG. 17 is a flowchart illustrating alternative exemplary processing performed by an output data correction device in accordance with a fourth embodiment.
Figure 18:
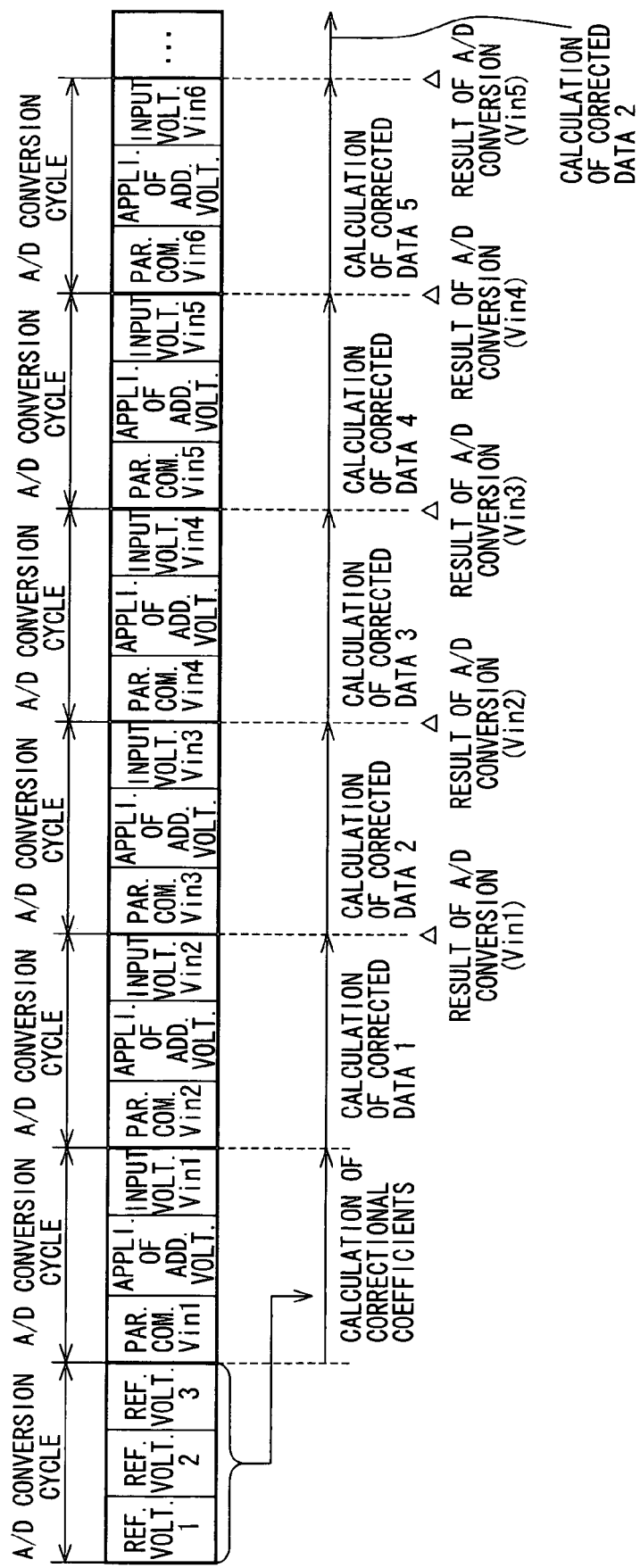
FIG. 18 is a timing chart illustrating alternative exemplary timing associated with the processing of FIG. 17.

FIG. 17 and FIG. 18 show a fourth embodiment. A difference from the third embodiment will be described below. The fourth embodiment has the same configuration as the third embodiment and calculates the correctional coefficients a, b, and c, in a manner similar to the second embodiment, only at the beginning or start of processing. In FIG. 17, since the correctional coefficients a, b, and c are first calculated based on the reference voltages N1, N2, and N3, the DAC 33 transmits an addition voltage at S91. The addition voltage in such a case should be 2.1875 V associated with the voltage domain (5). S70 to S78 are executed in the same manner as those in the third embodiment in order to calculate the correctional coefficients a, b, and c on the basis of the data values d1, d2, and d3 at S92.

Thereafter, S61 to S69 are executed in the same manner as in the third embodiment in order to store the contents of the d0 and d4 registers in the d0' and d4' registers respectively at S93. Correctional calculation is performed in the same manner as at S81 at S94, and S82 is then executed. In parallel with S93, S94, and S82, the processing from S61 to S69 is executed in order to convert and correct the next input voltage Vin.

FIG. 18 is a timing chart. In the first A/D conversion cycle, the reference voltages N1, N2, and N3 are A/D-converted. In the next conversion cycle, the input voltage Vin is compared with specific voltages, an addition voltage is applied, and A/D conversion is performed. Moreover, the correctional coefficients a, b, and c are calculated. In the subsequent cycles, comparison of the input voltage Vin, application of the addition voltage, and A/D conversion are repeatedly executed. Meanwhile, correctional calculation is performed relative to the immediately preceding cycle.

As mentioned above, according to the fourth embodiment, despite the configuration identical to that of the third embodiment, the same advantage as that of the second embodiment can be provided.

Fifth Embodiment

Figure 19:
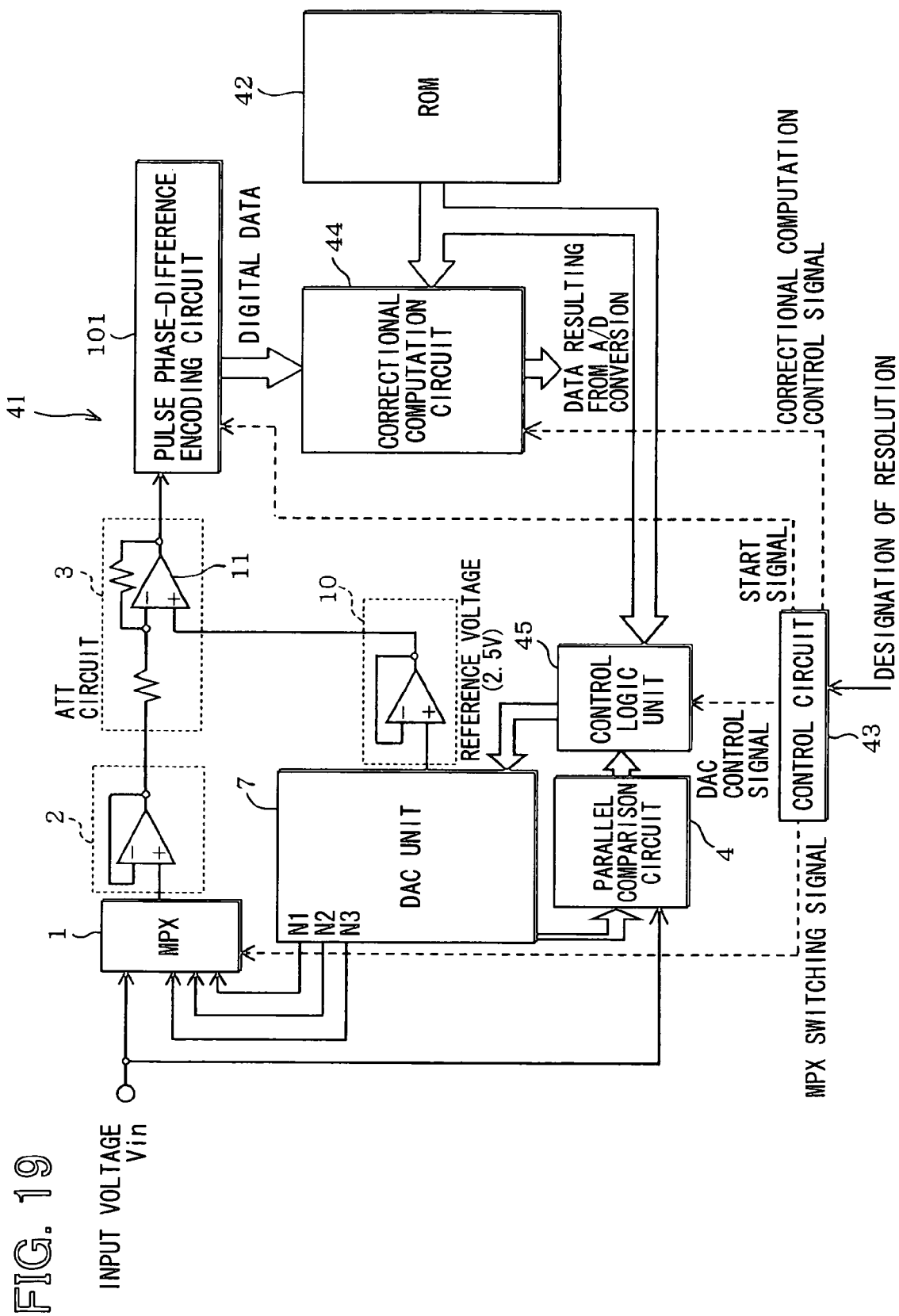
FIG. 19 is a block diagram illustrating configurations of an exemplary A/D conversion circuit and an exemplary data correction device in accordance with a fifth embodiment.
Figure 21:
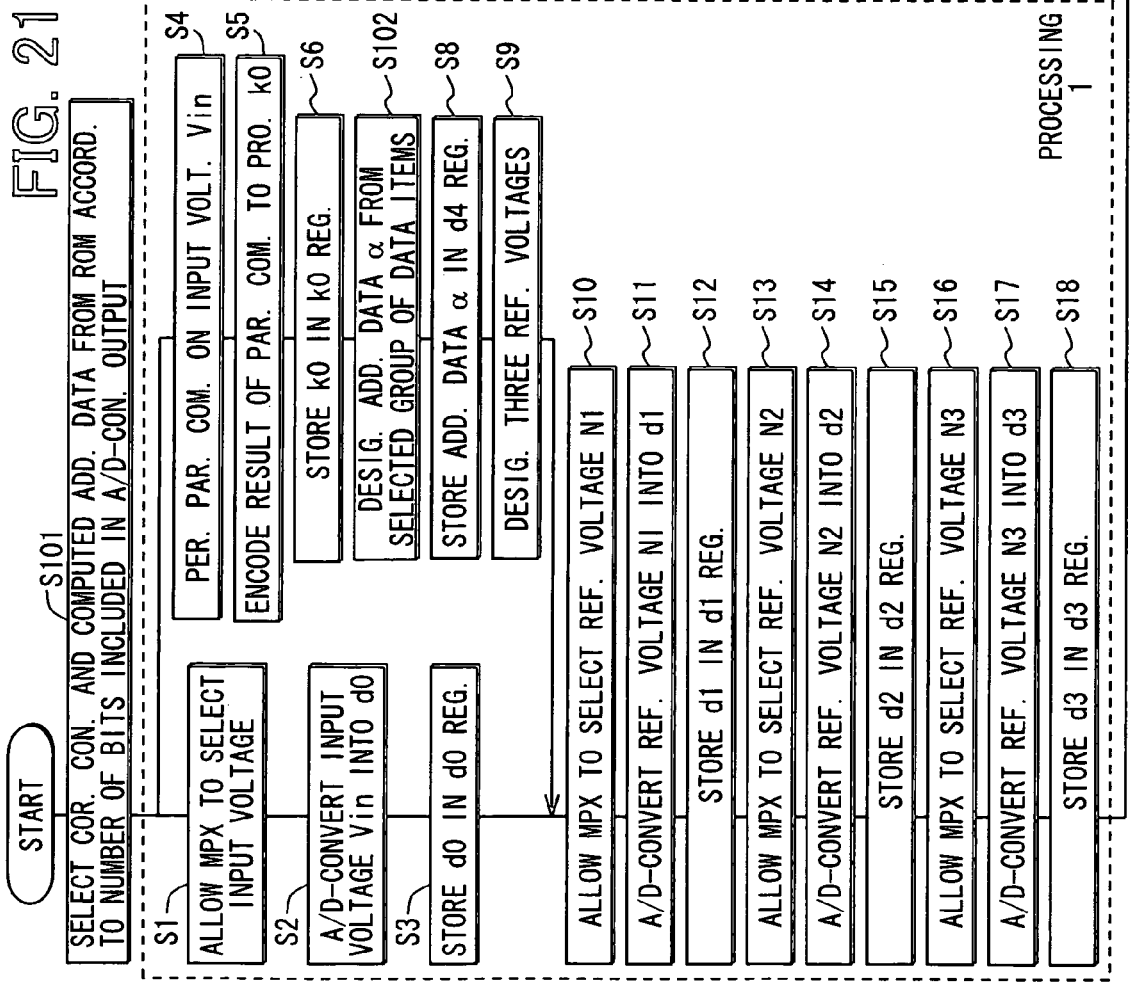
FIG. 21 is a flowchart illustrating alternative exemplary processing performed by an output data correction device.

FIG. 19 to FIG. 21 are concerned with the fifth embodiment. A difference from the first embodiment will be described below. An output data correction device 41 in accordance with the fifth embodiment is identical to the output data correction device in accordance with the first embodiment except that a ROM 42 is additionally included. Addition data α associated with a resolution in A/D conversion performed by a pulse phase-difference encoding circuit 101 is stored in the ROM 42.

FIG. 20 shows an example of data values stored in the ROM 42. In the first embodiment, the resolution in A/D conversion is 16 bits. In the fifth embodiment, assuming that the resolution is dynamically changed from 8 bits to 18 bits in units of 2 bits, addition data values α associated with the respective resolutions are stored in the ROM 42. For example, when the conversion resolution is 14 bits, the addition data values of the associated addition data α are a quarter of the addition data values when the conversion resolution is 16 bits. Further, when the conversion resolution is 18 bits, the addition data values of the associated addition data α are quadruple those of the addition data values when the conversion resolution is 16 bits. Moreover, since a correctional coefficient constant β associated with the resolution is needed to calculate the coefficients a and b according to the equations (2) and (3), the constant β is also stored in the ROM 42. It should be noted that the constant β is a boundary value associated with the reference of 2.5 V, that is, 4096 for a resolution of 16 bits.

Incidentally, the resolution in A/D conversion has the maximum value thereof defined by the hardware configuration of the pulse phase-difference encoding circuit 101. It is possible to decrease the maximum value if necessary by adding a switching component.

Data values stored in the ROM 42 are read in association with an externally designated resolution by the control circuit 43, and written in the register or RAM included in the correctional computation circuit 44 and control logic unit 45.

Next, an operation of the fifth embodiment will be described below with reference to FIG. 21 alike. FIG. 21 is an equivalent of FIG. 5. The control circuit 43 selects and reads data values α and β stored in the ROM 42 according to the externally designated resolution in A/D conversion prior to execution of S1, and writes the data values in each of the correctional computation circuit 44 and control logic unit 45 at S101. The control logic unit 45 executes S6, designates addition data α from a group of data values set in association with a code k0 by the control circuit 43 at S102, and then executes S8.

As mentioned above, according to a fifth embodiment, addition data α and a constant β which are associated with each resolution in A/D conversion are stored in the ROM 42. The control circuit 43 reads data values associated with a designated resolution from the ROM 42 and writes the data values in each of the correctional computation circuit 44 and control logic unit 45. Consequently, the resolution can be dynamically changed from one to another.

Sixth Embodiment

Figure 22:
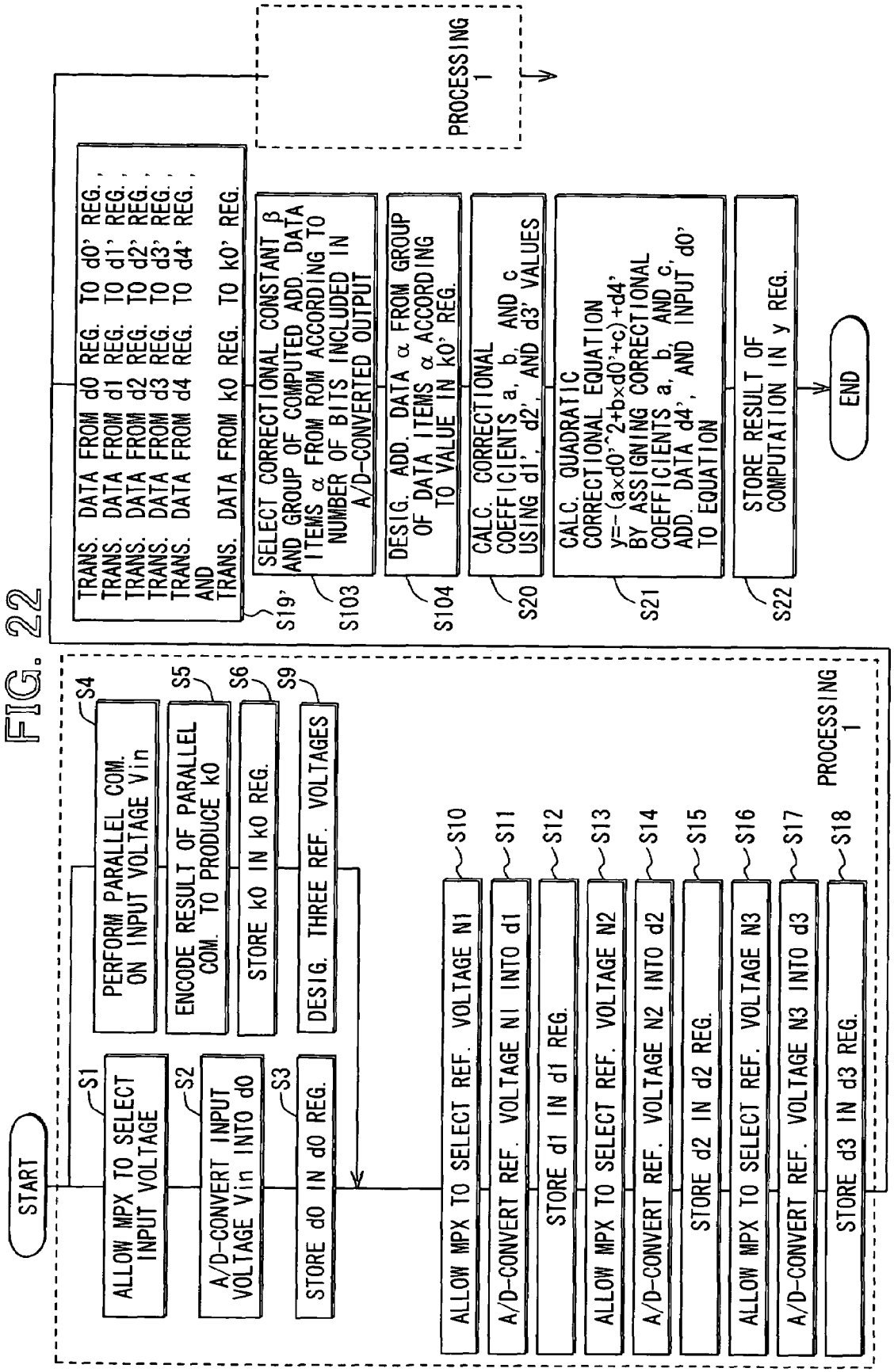
FIG. 22 is a flowchart illustrating alternative exemplary processing performed by an output data correction device in accordance with a sixth embodiment.

FIG. 22 is concerned with a sixth embodiment. A difference from the fifth embodiment will be described below. S103 and S104, which are equivalent to S101 and S102 in the fifth embodiment, are interposed between S19' and S20. S8 is excluded. At S19', the contents of the k0 register are transferred to the k0' register instead of transferring the contents of the d4 register to the d4' register. At S104, addition data α is designated by the control circuit 43 from a group of data values set in association with a value in the k0' register.

Seventh Embodiment

Figure 23:
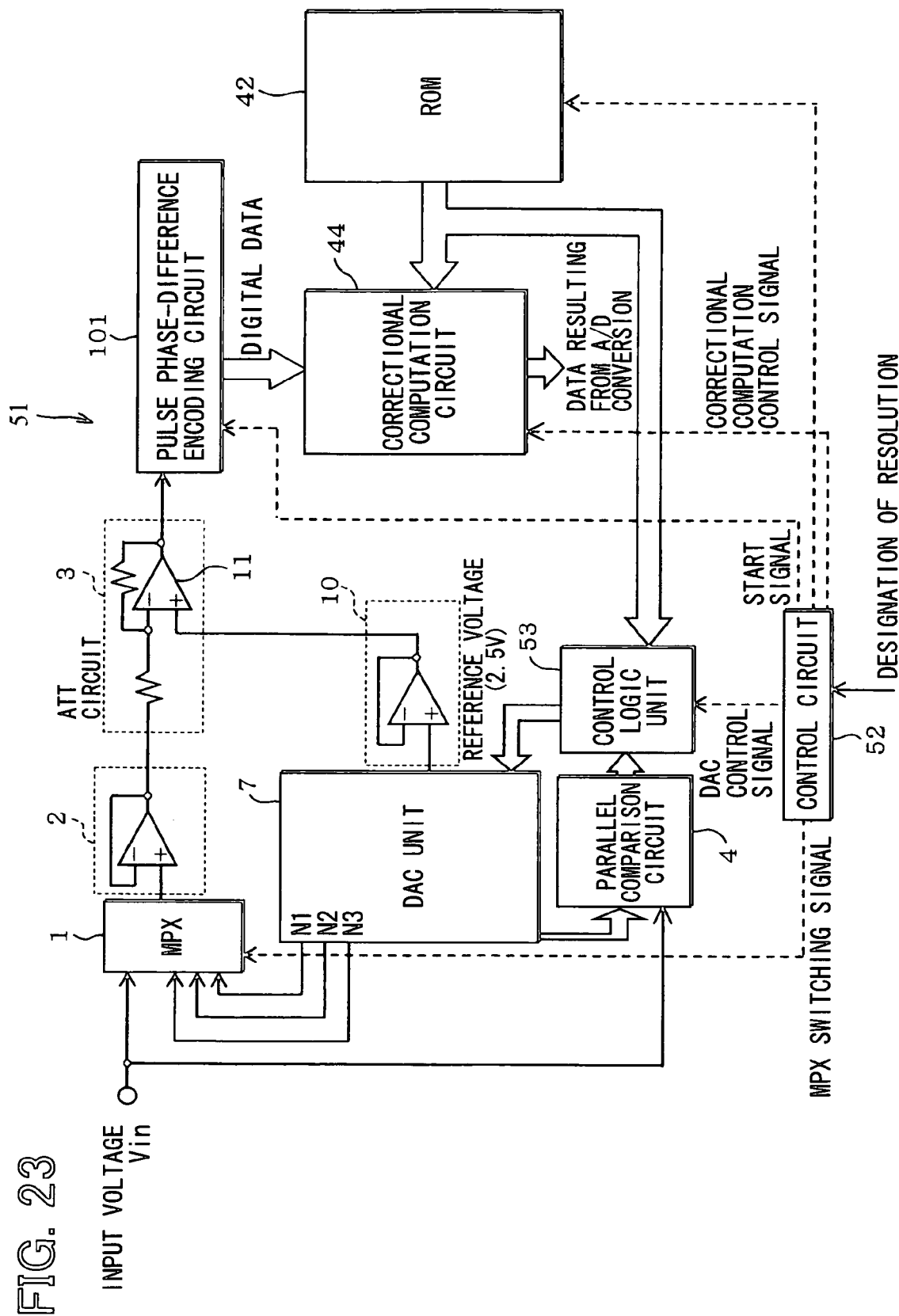
FIG. 23 is a block diagram illustrating configurations of an exemplary A/D conversion circuit and an exemplary data correction device in accordance with a seventh embodiment.

FIG. 23 shows a configuration in accordance with a seventh embodiment. An output data correction device 51 includes the same ROM 42 and correctional computation circuit 44 as those included in the fifth embodiment. A control circuit 52 substituted for the control circuit 35 sets or writes data, read from the ROM 42 according to a designated resolution, in each of the correctional computation circuit 44 and a control logic unit 53.

Processing corresponding to that of the S101 included in the fifth embodiment is executed first in the procedure described in the flowchart of FIG. 14, and processing corresponding to that of the S102 is executed in place of the S64.

Eighth Embodiment

FIG. 24 to FIG. 27 are concerned with an eighth embodiment, where a linear functional equation (n=1) is adopted as a correctional equation for correcting converted data d0 of an input voltage Vin. Specifically, coefficients a and b to be assigned to the linear functional equation (6) presented below are worked out.

$$y = a \times d0 + b \quad (6)$$

However, since the function is linear, three reference voltages N1, N2, and N3 are divided into two pairs each including a voltage N2. The first functional equation whose graph passes points N2 and N3 and the second functional equation whose graph passes points N1 and N2 are obtained mutually independently. Namely, coefficients a1 and b1 to be assigned to the first functional equation are worked out according to the following equations (7) and (8):

$$a1 = (4096)/(N2-N3) \quad (7)$$

$$b1 = 4096 - (a1 \times N2) + \alpha \quad (8)$$

Coefficients a2 and b2 to be assigned to the second functional equation are calculated according to the following equations (9) and (10):

$$a2 = (4096)/(N1-N2) \quad (9)$$

$$b2 = 4096 - (a2 \times N2) + \alpha \quad (10)$$

FIG. 24 lists addition data values α. A resolution in A/D conversion is 16 bits. However, since the functional equation is divided into two equations of the first and second functional equations, the addition data α of 4096 is replaced with a double value. A voltage domain starting with 2.5 V that serves as a reference for A/D conversion is associated with the addition data α of 0. Consequently, the distribution of the addition data values in positive and negative directions is asymmetric.

Figure 25:
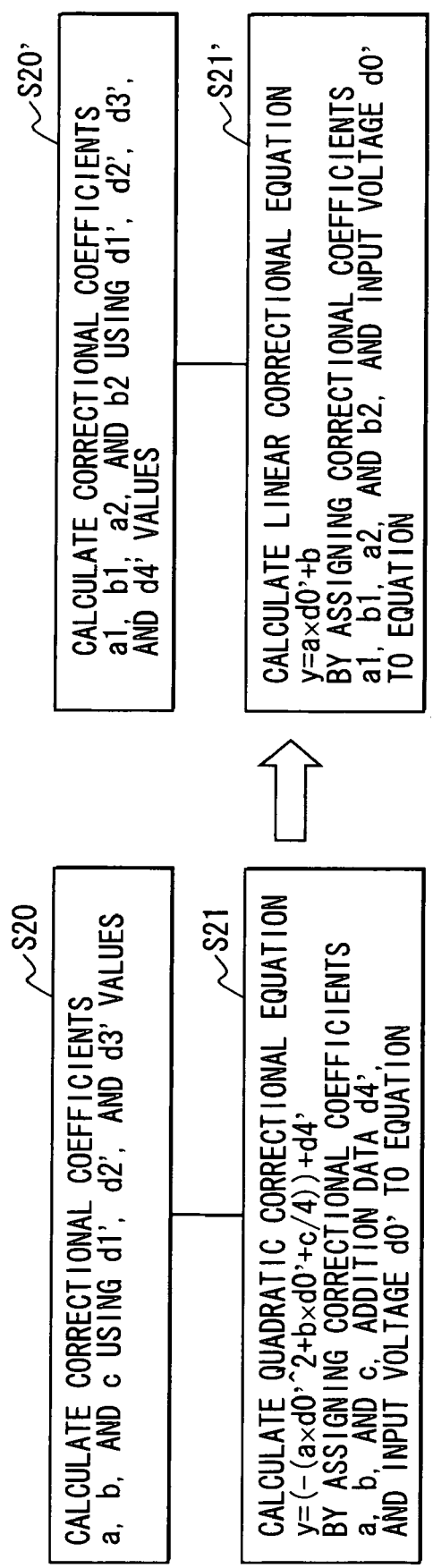
FIG. 25 is a partial flow chart illustrating an exemplary replacement portion for corresponding portions of the flowchart illustrated in FIG. 5.

The computations based on the equations (7) to (10) are executed by, as presented in FIG. 25, replacing the S20 and S21 in the flowchart of FIG. 5 with S20' and S21'.

Figure 26:
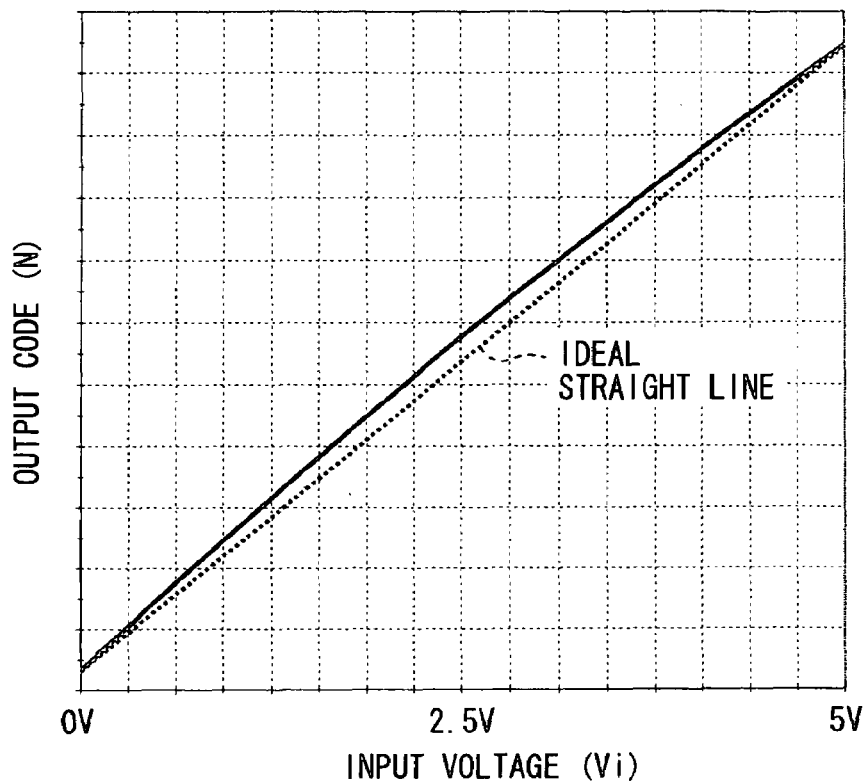
FIG. 26 is a graph illustrating an exemplary output code N resulting from A/D conversion performed on an input voltage Vi by an exemplary pulse phase-difference encoding circuit.
Figure 27:
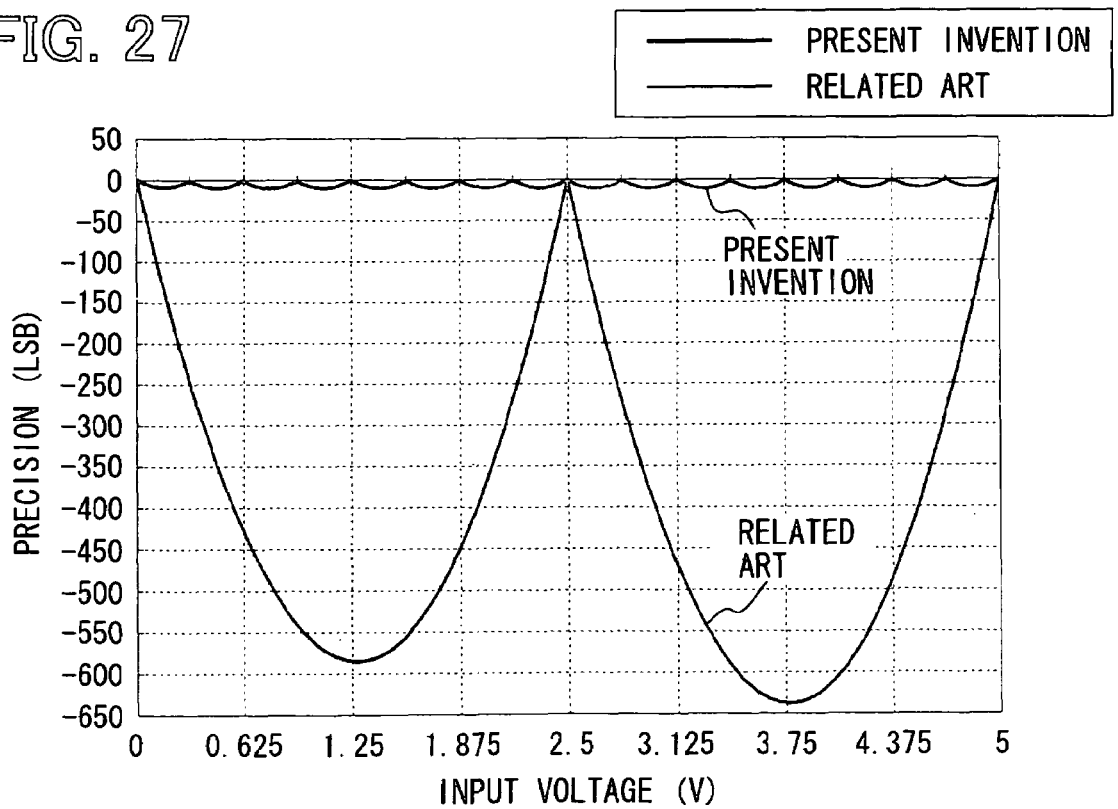
FIG. 27 is a graph illustration comparative precision between correction in accordance with various exemplary embodiments and prior art correction.

FIG. 26 shows data N, which can be data or a code, resulting from A/D conversion performed on an input voltage Vi. Data N can range from 0 V to 5 V, and can be output, for example, by a pulse phase-difference encoding circuit 101. As can be seen, since the immediately converted data contains errors, for example, as shown in FIG. 7B, a line plotted by linking points of data values deviates from an ideal straight line indicated with a doted line. In FIG. 27, a precision attained when correction is performed according to the eighth embodiment is compared with the precision attained when such correction is not performed. Even when the linear function is used for correction, the error is much smaller than that occurring in the prior art.

In the eighth embodiment, since the linear functional equation is adopted as the correctional equation, a correctional equation is obtained relative to each of two pairs into which the reference voltages N1, N2, and N3 are divided so that each pair will include the reference voltage N2. Consequently, an n-th order functional equation is a discontinuous functional equation.

As mentioned above, according to the eighth embodiment, three reference voltages N1, N2, and N3 are divided into two pairs each including the reference voltage N2. The first functional equation whose graph passes the points N2 and N3 defined in a two-dimensional coordinate system in which the axis of ordinates indicates reference voltages and the axis of abscissas indicates A/D-converted data values, and the second functional equation whose graph passes the points N1 and N2 defined therein are computed and determined mutually independently. Data A/D-converted by the pulse phase-difference encoding circuit 101 is corrected using two linear functional equations associated with a domain to which the input voltage Vin is decided to belong.

The invention is not limited exclusively to the embodiments described herein particularly since variants, extensions, equivalents including those variants, extensions, equivalents described below and others not specifically described can be made by one of ordinary skill. For example, four or more reference voltages may be designated for each domain. Further, the A/D conversion circuit is not limited to the pulse phase-difference encoding circuit 101, but may be realized with any circuit as long as the A/D conversion characteristic of the circuit is non-linear.

Further, the invention is not limited with regard to certain values. For example, the range of input voltages Vin is not limited to the range from 0 V to 5 V. The A/D conversion circuit need not necessarily be designed to with 16 bit resolution on the output thereof. Instead, the number of bits to be converted may be varied depending on an individual design. The DAC unit 7 may have one output terminal via which a signal is transmitted to the multiplexer 1. The DAC unit 7 may be designed to switch reference voltages, which are to be transmitted relative to each domain, from one set to another.

In the first embodiment, when an input voltage range supported by the A/D conversion circuit is squared with a domain to which the input voltage Vin belongs, the ATT circuit 3 is not needed. In the fifth to seventh embodiments, a group of data values is stored in the ROM 42 in association with resolutions. In various exemplary embodiments, the designation of resolutions may be modified. The order n of a functional equation for use in correction is not limited to 1 or 2. The fifth embodiment may be applied to the eighth embodiment.

What is claimed is:

1. An output data correction device for correcting a non-linearity of an analog-to-digital (A/D) conversion circuit that converts an analog signal to digital data, the output data correction device comprising:

a deciding means for deciding to which of a plurality of domains that an estimated maximum input range is divided a voltage input to the A/D conversion circuit belongs;

a reference voltage designating means for selecting and transmitting at least three reference voltages associated with each of the plurality of domains;

an input selecting means for selecting one of among an input voltage and the reference voltages as a signal to be input to the A/D conversion circuit;

a correctional equation determining means for computing and determining a respective n-th order functional equation when the input selecting means selects each of the reference voltages, the respective n-th order functional equation having a graph that passes through a coordinate point associated with a respective one of the three or more reference voltages in a two-dimensional coordinate system in which the axis of ordinates indicates reference voltages and the axis of abscissas indicates values of digital data converted by the A/D conversion circuit; and a correcting means for correcting the converted digital data using the respective n-th order functional equation associated with a domain to which the input voltage is decided to belong by the deciding means, when the input selecting means selects the input voltage,.

2. The output data correction device for an A/D conversion circuit according to claim 1, wherein:

the input select means first selects each of the reference voltages as the signal to be input to the A/D conversion circuit;

the reference voltage designating means sequentially selects and transmits the reference voltages associated with each of the plurality of domains; and the correctional equation determining means sequentially determines the respective n-th order functional equation associated with each of the plurality of domains, and holds the determined functional data values.

3. The output data correction device for an A/D conversion circuit according to claim 1, wherein:

the A/D conversion circuit includes a pulse cycling circuit having a plurality of reversal circuits configured in a ring circuit and reversing the input signal, a reversal action time of the reversal circuits varying depending on a supply voltage, one of the reversal circuits constructed as a startup reversal circuit whose reversal action is externally controllable to thereby cause a pulse signal to cycle along with the startup of the startup reversal circuit, an analog signal input terminal coupled to power lines of the respective reversal circuits in the pulse cycling circuit and the signal input terminal applying an analog signal as a supply voltage to the reversal circuits, a counter that counts the number of times by which the pulse signal cycles in the pulse cycling circuit and that transmits the result of the counting as digital data, and a control means that actuates the startup reversal circuit so as to initiate cycling in the pulse cycling circuit; and the A/D conversion circuit transmits the digital data as part of the result of A/D conversion.

4. The output data correction device for an A/D conversion circuit according to claim 1, wherein n is set to 2.

5. The output data correction device for an A/D conversion circuit according to claim 1, wherein:

every time the A/D conversion circuit A/D-converts a new input voltage, the input selecting means selects each of the reference voltages; and the correctional equation determining means computes a new n-th order functional equation.

6. The output data correction device for an A/D conversion circuit according to claim 5, wherein:

the A/D conversion circuit includes a pulse cycling circuit having a plurality of reversal circuits configured in a ring circuit and reversing the input signal, a reversal action time of the reversal circuits varying depending on a supply voltage, one of the reversal circuits constructed as a startup reversal circuit whose reversal action is externally controllable to thereby cause a pulse signal to cycle along with the startup of the startup reversal circuit, an analog signal input terminal coupled to power lines of the respective reversal circuits in the pulse cycling circuit and the signal input terminal applying an analog signal as a supply voltage to the reversal circuits, a counter that counts the number of times by which the pulse signal cycles in the pulse cycling circuit and that transmits the result of the counting as digital data, and a control means that actuates the startup reversal circuit so as to initiate cycling in the pulse cycling circuit; and the A/D conversion circuit transmits the digital data as part of the result of A/D conversion.

7. The output data correction device for an A/D conversion circuit according to claim 5, wherein n is set to 2.

8. An output data correction device for correcting a non-linearity of an analog-to-digital (A/D) conversion circuit that converts an analog signal into digital data, the output data correction device comprising:

a deciding means for deciding to which of a plurality of domains that an estimated maximum input range is divided, a voltage input to the A/D conversion circuit belongs;

a level converting means for converting an input signal level so that the level of the signal to be input to the A/D conversion circuit will fall within a predetermined range;

a reference voltage designating means for designating at least three reference voltages in association with the predetermined range within which the input signal level falls;

an input selecting means for selecting one of the input voltage and each of the reference voltages to be input to the A/D conversion circuit;

a correctional equation determining means for computing and determining an n-th order functional equation having a graph that passes through coordinate points associated with the three or more reference voltages when the input selecting means selects the each of the reference voltages, the coordinate points in a two-dimensional coordinate system having an axis of ordinates that indicates reference voltages and the axis of abscissas indicates values of digital data converted by the A/D conversion circuit; and a correcting means for correcting the converted digital data using the n-th order functional equation when the input selecting means selects the input voltage, wherein:

the level converting means adds a regulation voltage associated with a domain decided by the deciding means to the input voltage.

9. The output data correction device for an A/D conversion circuit according to claim 8, wherein:

every time the A/D conversion circuit A/D-converts a new input voltage, the input selecting means selects each of the reference voltages; and the correctional equation determining means computes a new n-th order functional equation.

10. The output data correction device for an A/D conversion circuit according to claim 8, wherein n is set to 2.

11. The output data correction device for an A/D conversion circuit according to claim 8, wherein:

the input select means first selects each of the reference voltages as the signal to be input to the A/D conversion circuit;

the reference voltage designating means sequentially selects and transmits the reference voltages associated with each of the plurality of domains; and the correctional equation determining means sequentially determines the respective n-th order functional equation associated with each of the plurality of domains, and holds the determined functional data values.

12. A method for correcting analog-to-digital (A/D)-converted output data associated with a non-linearity in an A/D conversion circuit that converts an analog signal into digital data, comprising:

deciding to which of a plurality of domains that an estimated maximum input range is divided, a voltage input to the A/D conversion circuit belongs;

selecting at least three reference voltages associated with the decided domain and computing and determining an n-th order functional equation having a graph that passes through three or more coordinate points in a two-dimensional coordinate system in which the axis of ordinates indicates reference voltages and the axis of abscissas indicates values of digital data converted by the A/D conversion circuit; and computing the n-th order functional equation by assigning the converted digital data to the computed equation and thus correcting the non-linearity.

13. The A/D-converted output data correction method according to claim 12, wherein n is set to 2.

14. The A/D-converted output data correction method according to claim 12, wherein every time the A/D conversion circuit A/D-converts a new input voltage, a new n-th order functional equation is computed, and the correction is performed based on the result of the computation of the new n-th order functional equation.

15. An A/D-converted output data correction method for correcting the non-linearity in A/D conversion of an A/D conversion circuit that converts an analog signal to digital data, comprising:

deciding to which of a plurality of domains an estimated maximum input range is divided, an input signal level that is input to the A/D conversion circuit belongs;

adding a regulation voltage associated with the decided domain to convert the input signal level causing the input signal level to fall within a predetermined range;

designating at least three reference voltages in association with the predetermined range to which the input signal level belongs, and computing and determining an n-th order functional equation whose graph passes coordinate points, which represent the three or more reference voltages, in a two-dimensional coordinate system in which the axis of ordinates indicates reference voltages and the axis of abscissas indicates digital data values into which the reference voltages are converted by the A/D conversion circuit; and correcting digital data, which is converted by the A/D conversion circuit, using the n-th order functional equation.

16. The A/D-converted output data correction method according to claim 15, wherein every time the A/D conversion circuit A/D-converts a new input voltage, a new n-th order functional equation is computed, and the correction is performed based on the result of the computation of the new n-th order functional equation.

17. The A/D-converted output data correction method according to claim 15, wherein n is set to 2.

18. The A/D-converted output data correction method according to claim 15, wherein n is set to 2.

* * * * *